United States Patent
Kato et al.

(10) Patent No.: US 10,151,031 B2
(45) Date of Patent: Dec. 11, 2018

(54) METHOD FOR PROCESSING A SUBSTRATE AND SUBSTRATE PROCESSING APPARATUS

(71) Applicant: Tokyo Electron Limited, Tokyo (JP)

(72) Inventors: Hitoshi Kato, Iwate (JP); Jun Sato, Iwate (JP); Masahiro Murata, Iwate (JP); Kentaro Oshimo, Yamanashi (JP); Tomoko Sugano, Iwate (JP); Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/617,102

(22) Filed: Jun. 8, 2017

(65) Prior Publication Data

US 2017/0268104 A1 Sep. 21, 2017

Related U.S. Application Data

(63) Continuation of application No. 14/613,656, filed on Feb. 4, 2015, now Pat. No. 9,714,467.

(30) Foreign Application Priority Data

Feb. 10, 2014 (JP) .................................. 2014-023006
Oct. 7, 2014 (JP) .................................. 2014-206571

(51) Int. Cl.
| | | |
|---|---|---|
| *H01L 21/02* | (2006.01) | |
| *C23C 16/458* | (2006.01) | |
| *C23C 16/455* | (2006.01) | |
| *C23C 16/34* | (2006.01) | |

(Continued)

(52) U.S. Cl.
CPC ........ *C23C 16/4584* (2013.01); *C23C 16/345* (2013.01); *C23C 16/45519* (2013.01); *C23C 16/45538* (2013.01); *C23C 16/45551* (2013.01); *C23C 16/507* (2013.01); *H01L 21/0217* (2013.01); *H01L 21/0228* (2013.01); *H01L 21/02274* (2013.01); *C23C 16/52* (2013.01)

(58) Field of Classification Search
None
See application file for complete search history.

(56) References Cited

U.S. PATENT DOCUMENTS

| | | |
|---|---|---|
| 4,854,266 A | 8/1989 | Simson et al. |
| 5,281,274 A | 1/1994 | Yoder |
| 5,620,523 A | 4/1997 | Maeda et al. |

(Continued)

FOREIGN PATENT DOCUMENTS

| | | |
|---|---|---|
| CN | 1269046 | 10/2000 |
| CN | 101076878 | 11/2007 |

(Continued)

*Primary Examiner* — Mounir S Amer
(74) *Attorney, Agent, or Firm* — IPUSA, PLLC

(57) ABSTRACT

A method for processing a substrate is provided. According to the method, a process gas is supplied to a surface of a substrate, and then a separation gas is supplied to the surface of the substrate. Moreover, a first plasma processing gas is supplied to the surface of the substrate in a first state in which a distance between the first plasma generation unit and the turntable is set at a first distance, and a second plasma processing gas is supplied to the surface of the substrate in a second state in which a distance between the second plasma generation unit and the turntable is set at a second distance shorter than the first distance. Furthermore, the separation gas is supplied to the surface of the substrate.

8 Claims, 18 Drawing Sheets

(51) Int. Cl.
*C23C 16/507* (2006.01)
*C23C 16/52* (2006.01)

(56) References Cited

U.S. PATENT DOCUMENTS

| | | | |
|---|---|---|---|
| 5,744,049 A | 4/1998 | Hills et al. |
| 5,849,088 A | 12/1998 | DeDontney et al. |
| 5,906,354 A | 5/1999 | Gilbert et al. |
| 6,279,503 B1 | 8/2001 | Choi et al. |
| 6,340,501 B1 | 1/2002 | Kamiyama et al. |
| 6,634,314 B2 | 10/2003 | Hwang et al. |
| 7,153,542 B2 | 12/2006 | Nguyen et al. |
| 8,034,723 B2 | 10/2011 | Ohizumi et al. |
| 8,092,598 B2 | 1/2012 | Baek et al. |
| 8,372,202 B2 | 2/2013 | Kato et al. |
| 8,465,591 B2 | 6/2013 | Kato et al. |
| 8,465,592 B2 | 6/2013 | Kato et al. |
| 8,518,183 B2 | 8/2013 | Honma |
| 8,673,079 B2 | 3/2014 | Kato et al. |
| 8,673,395 B2 | 3/2014 | Kato et al. |
| 8,721,790 B2 | 5/2014 | Kato et al. |
| 8,746,170 B2 | 6/2014 | Orito et al. |
| 8,808,456 B2 | 8/2014 | Kato et al. |
| 8,835,332 B2 | 9/2014 | Kato et al. |
| 8,840,727 B2 | 9/2014 | Kato et al. |
| 8,845,857 B2 | 9/2014 | Ohizumi et al. |
| 8,854,449 B2 | 10/2014 | Aikawa et al. |
| 8,882,915 B2 | 11/2014 | Kato et al. |
| 8,882,916 B2 | 11/2014 | Kumagai et al. |
| 8,906,246 B2 | 12/2014 | Kato et al. |
| 8,951,347 B2 | 2/2015 | Kato et al. |
| 8,961,691 B2 | 2/2015 | Kato et al. |
| 8,962,495 B2 | 2/2015 | Ikegawa et al. |
| 8,992,685 B2 | 3/2015 | Kato et al. |
| 9,023,738 B2 | 5/2015 | Kato et al. |
| 9,040,434 B2 | 5/2015 | Kato |
| 9,053,909 B2 | 6/2015 | Kato et al. |
| 9,103,030 B2 | 8/2015 | Kato et al. |
| 9,111,747 B2 | 8/2015 | Yamawaku et al. |
| 9,136,133 B2 | 9/2015 | Oshimo et al. |
| 2002/0195056 A1 | 12/2002 | Sandhu et al. |
| 2004/0052972 A1 | 3/2004 | Schmitt |
| 2006/0177579 A1 | 8/2006 | Shin et al. |
| 2006/0196538 A1 | 9/2006 | Kubista et al. |
| 2007/0215036 A1 | 9/2007 | Park et al. |
| 2007/0218701 A1 | 9/2007 | Shimizu et al. |
| 2007/0218702 A1 | 9/2007 | Shimizu et al. |
| 2008/0208385 A1 | 8/2008 | Sakamoto et al. |
| 2008/0216864 A1 | 9/2008 | Sexton et al. |
| 2009/0272402 A1 | 11/2009 | Kim et al. |
| 2009/0324826 A1 | 12/2009 | Kato et al. |
| 2009/0324828 A1 | 12/2009 | Kato et al. |
| 2010/0050942 A1 | 3/2010 | Kato et al. |
| 2010/0050943 A1 | 3/2010 | Kato et al. |
| 2010/0050944 A1 | 3/2010 | Kato et al. |
| 2010/0055297 A1 | 3/2010 | Kato et al. |
| 2010/0055312 A1 | 3/2010 | Kato et al. |
| 2010/0055314 A1 | 3/2010 | Kato et al. |
| 2010/0055315 A1 | 3/2010 | Honma |
| 2010/0055316 A1 | 3/2010 | Honma |
| 2010/0055319 A1 | 3/2010 | Kato et al. |
| 2010/0055320 A1 | 3/2010 | Honma |
| 2010/0055347 A1 | 3/2010 | Kato et al. |
| 2010/0055351 A1 | 3/2010 | Kato et al. |
| 2010/0116210 A1 | 5/2010 | Kato et al. |
| 2010/0124610 A1 | 5/2010 | Aikawa et al. |
| 2010/0132614 A1 | 6/2010 | Kato et al. |
| 2010/0132615 A1 | 6/2010 | Kato et al. |
| 2010/0136795 A1 | 6/2010 | Honma |
| 2010/0151131 A1 | 6/2010 | Obara et al. |
| 2010/0227046 A1 | 9/2010 | Kato et al. |
| 2010/0227059 A1 | 9/2010 | Kato et al. |
| 2010/0260935 A1 | 10/2010 | Kato et al. |
| 2010/0260936 A1 | 10/2010 | Kato et al. |
| 2011/0039026 A1 | 2/2011 | Kato et al. |
| 2011/0048326 A1 | 3/2011 | Kato et al. |
| 2011/0100489 A1 | 5/2011 | Orito et al. |
| 2011/0104395 A1 | 5/2011 | Kumagai et al. |
| 2011/0126985 A1 | 6/2011 | Ohizumi et al. |
| 2011/0139074 A1 | 6/2011 | Kato et al. |
| 2011/0151122 A1 | 6/2011 | Kato et al. |
| 2011/0155056 A1 | 6/2011 | Kato et al. |
| 2011/0155057 A1 | 6/2011 | Kato et al. |
| 2011/0159187 A1 | 6/2011 | Kato et al. |
| 2011/0159188 A1 | 6/2011 | Kato et al. |
| 2011/0159702 A1 | 6/2011 | Ohizumi et al. |
| 2011/0214611 A1 | 9/2011 | Kato et al. |
| 2011/0236598 A1 | 9/2011 | Kumagai et al. |
| 2012/0075460 A1 | 3/2012 | Aikawa et al. |
| 2012/0076937 A1 | 3/2012 | Kato et al. |
| 2012/0222615 A1 | 9/2012 | Kato et al. |
| 2012/0267341 A1 | 10/2012 | Kato et al. |
| 2013/0059415 A1 | 3/2013 | Kato et al. |
| 2013/0122718 A1 | 5/2013 | Kato et al. |
| 2013/0164942 A1 | 6/2013 | Kato et al. |
| 2013/0251904 A1 | 9/2013 | Kato et al. |
| 2013/0337635 A1 | 12/2013 | Yamawaku et al. |
| 2013/0337658 A1 | 12/2013 | Ikegawa et al. |
| 2014/0017909 A1 | 1/2014 | Kato |
| 2014/0170859 A1 | 6/2014 | Yamawaku et al. |
| 2014/0174351 A1 | 6/2014 | Aikawa |
| 2014/0199856 A1 | 7/2014 | Kato et al. |
| 2014/0213068 A1 | 7/2014 | Kato et al. |
| 2014/0220260 A1 | 8/2014 | Yamawaku et al. |
| 2014/0345523 A1 | 11/2014 | Kikuchi et al. |
| 2014/0349032 A1 | 11/2014 | Kato et al. |
| 2015/0011087 A1 | 1/2015 | Oshimo et al. |
| 2015/0024143 A1 | 1/2015 | Kumagai et al. |
| 2015/0031218 A1 | 1/2015 | Karakawa |
| 2015/0078864 A1 | 3/2015 | Sato et al. |
| 2015/0079807 A1 | 3/2015 | Tamura et al. |
| 2015/0184293 A1 | 7/2015 | Kato et al. |
| 2015/0184294 A1 | 7/2015 | Kato et al. |
| 2015/0214029 A1 | 7/2015 | Hane et al. |
| 2015/0225849 A1 | 8/2015 | Kato et al. |

FOREIGN PATENT DOCUMENTS

| | | |
|---|---|---|
| JP | H04-287912 | 10/1992 |
| JP | 3144664 | 3/2001 |
| JP | 2001-254181 | 9/2001 |
| JP | 2007-247066 | 9/2007 |
| JP | 2013-161874 | 8/2013 |
| JP | 2013-165116 | 8/2013 |
| WO | 2006/065014 | 6/2006 |
| WO | 2013/137115 | 9/2013 |

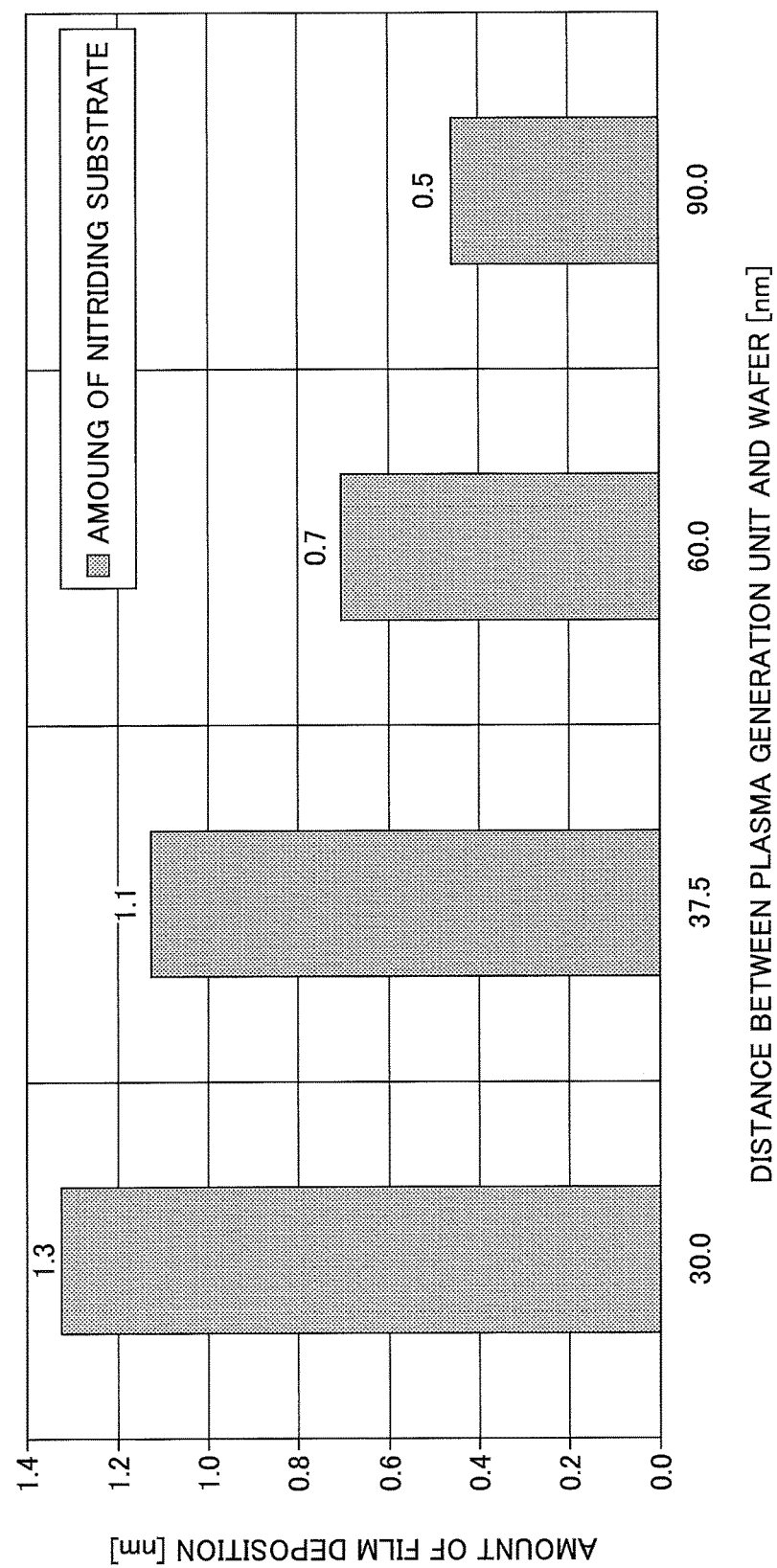

METHOD FOR PROCESSING A SUBSTRATE AND SUBSTRATE PROCESSING APPARATUS

CROSS-REFERENCE TO RELATED APPLICATIONS

This patent application is a continuation application of and claims the benefit of priority under 35 U.S.C. 120 to patent application Ser. No. 14/613,656 filed on Feb. 4, 2015, which is based upon and claims the benefit of priority of Japanese Patent Application No. 2014-23006, filed on Feb. 10, 2014, and Japanese Patent Application No. 2014-206571, filed on Oct. 7, 2014, the entire contents of which are incorporated herein by reference.

BACKGROUND OF THE INVENTION

1. Field of the Invention

The present invention relates to a method for processing a substrate and a substrate processing apparatus.

2. Description of the Related Art

In manufacturing semiconductor devices, a variety of film deposition processes is performed on a semiconductor wafer (hereinafter, "wafer") by a film deposition method such as an ALD (Atomic Layer Deposition) method.

In recent years, so-called turntable type film deposition apparatuses have been researched and developed as a film deposition apparatus that performs the ALD method. The film deposition apparatus includes a rotatable turntable provided in a vacuum chamber, and the turntable has a plurality of concave portions formed therein with a diameter slightly larger than a wafer, on each of which a wafer is placed. The vacuum chamber includes a supply area of a reaction gas A, a supply area of a reaction gas B, and separation areas separating the supply areas from each other all of which are provided above the turntable so as to be separated from each other.

Moreover, the turntable type film deposition apparatus sometimes includes a plasma generation unit mounted thereon, for example, as disclosed in Japanese Laid-Open Patent Application Publication No. 2013-161874. The film deposition process and the like of a variety of (functional) films are performed on substrates by using plasma generated by the plasma generation unit.

However, in the film deposition process using the substrate processing apparatus as disclosed in Japanese Laid-Open Patent Application Publication No. 2013-161874 and the like, what is called a loading effect is generated in which an amount of film deposition within a surface of a wafer varies depending on a surface area of a pattern formed in the surface of the wafer.

SUMMARY OF THE INVENTION

Embodiments of the present invention provide a method for processing a substrate and a substrate processing apparatus solving one or more of the problems discussed above.

More specifically, embodiments of the present invention provide a method for processing a substrate and a substrate processing apparatus that can prevent generation of a loading effect and can deposit a thin film having a desired film quality.

According to one embodiment of the present invention, there is provided a method for processing a substrate using a substrate processing apparatus. The apparatus includes a vacuum chamber, and a turntable having a substrate receiving portion formed in a surface thereof to receive a substrate thereon provided in the vacuum chamber. The apparatus also includes a process gas supply unit configured to supply a process gas that adsorbs on a surface of the substrate, a first plasma processing gas supply unit configured to supply a first plasma processing gas to the surface of the substrate, and a second plasma processing gas supply unit configured to supply a second plasma processing gas to the surface of the substrate. The apparatus further includes a first separation gas supply unit configured to supply a separation gas for separating the first plasma processing gas from the first process gas to the surface of the substrate, and a second separation gas supply unit configured to supply the separation gas for separating the second plasma processing gas from the first process gas to the surface of the substrate. The apparatus also includes a first plasma generation unit configured to convert the first plasma processing gas to first plasma, and a second plasma generation unit configured to convert the second plasma processing gas to second plasma. The process gas supply unit, the first separation gas supply unit, the first plasma processing gas supply unit, the second plasma processing gas supply unit and the second separation gas supply unit are arranged in a rotational direction of the turntable in this order. In the method, the process gas is supplied to the surface of the substrate, and the separation gas is supplied to the surface of the substrate. Moreover, the first plasma processing gas is supplied to the surface of the substrate in a first state in which a distance between the first plasma generation unit and the turntable is set at a first distance, and then the second plasma processing gas is supplied to the surface of the substrate in a second state in which a distance between the second plasma generation unit and the turntable is set at a second distance shorter than the first distance. In addition, the separation gas is supplied to the surface of the substrate.

According to another embodiment of the present invention, there is provided a method for processing a substrate. In the method, a silicon-containing gas is supplied to a surface of a substrate provided in a chamber so as to cause the silicon-containing to adsorb on the surface of the substrate. Next, a first plasma treatment is performed on the surface of the substrate having the silicon-containing gas adsorbing on the surface of the substrate by using first plasma generated from a first plasma processing gas containing hydrogen gas. Moreover, a second plasma treatment is performed on the surface of the substrate subject to the first plasma treatment by using second plasma generated from a second plasma processing gas containing ammonia gas and no hydrogen gas.

According to another embodiment of the present invention, there is provided a substrate processing apparatus. The apparatus includes a vacuum chamber, a turntable having a substrate receiving portion formed in a surface thereof to receive a substrate thereon provided in the vacuum chamber, and a process gas supply unit configured to supply a process gas that adsorbs on a surface of the substrate. The apparatus also includes a first plasma processing gas supply unit configured to supply a first plasma processing gas to the surface of the substrate, and a second plasma processing gas supply unit configured to supply a second plasma processing gas to the surface of the substrate. The apparatus further includes a first separation gas supply unit configured to supply a separation gas for separating the first plasma processing gas from the process gas to the surface of the substrate, and a second separation gas supply unit configured to supply the separation gas for separating the second plasma processing gas from the process gas to the surface of the substrate. The apparatus also includes a first plasma generation unit configured to convert the first plasma processing gas to first plasma, a second plasma generation unit configured to convert the second plasma processing gas to second plasma, and a control unit. The process gas supply unit, the first separation gas supply unit, the first plasma processing gas supply unit, the second plasma processing gas supply unit and the second separation gas supply unit are arranged in a rotational direction of the turntable in this order. The control unit is configured to cause the process gas supply unit to supply the process gas to the surface of the substrate, to cause the first separation gas supply unit to supply the separation gas to the surface of the substrate, to cause the first plasma processing gas supply unit to supply the first plasma processing gas to the surface of the substrate in a first state in which a distance between the first plasma generation unit and the turntable is set at a first distance, to cause the second plasma processing gas supply unit to supply the second plasma processing gas to the surface of the substrate in a second state in which a distance between the second plasma generation unit and the turntable is set at a second distance shorter than the first distance, and to cause the second separation gas supply unit to supply the separation gas to the surface of the substrate.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 13 is a schematic diagram for explaining another example of the effect of the method for processing the substrate according to an embodiment of the present invention;

DETAILED DESCRIPTION OF THE PREFERRED EMBODIMENTS

A description is given below of a substrate processing apparatus preferable for implementing a method for processing a substrate according to embodiments of the present invention, with reference to accompanying drawings. The substrate processing apparatus according to the embodiments is configured to deposit a thin film by layering a reaction product on a surface of a wafer W by an ALD method and to perform a plasma treatment on the wafer in the middle of depositing the thin film.

[Configuration of Substrate Processing Apparatus]

Figure 1:
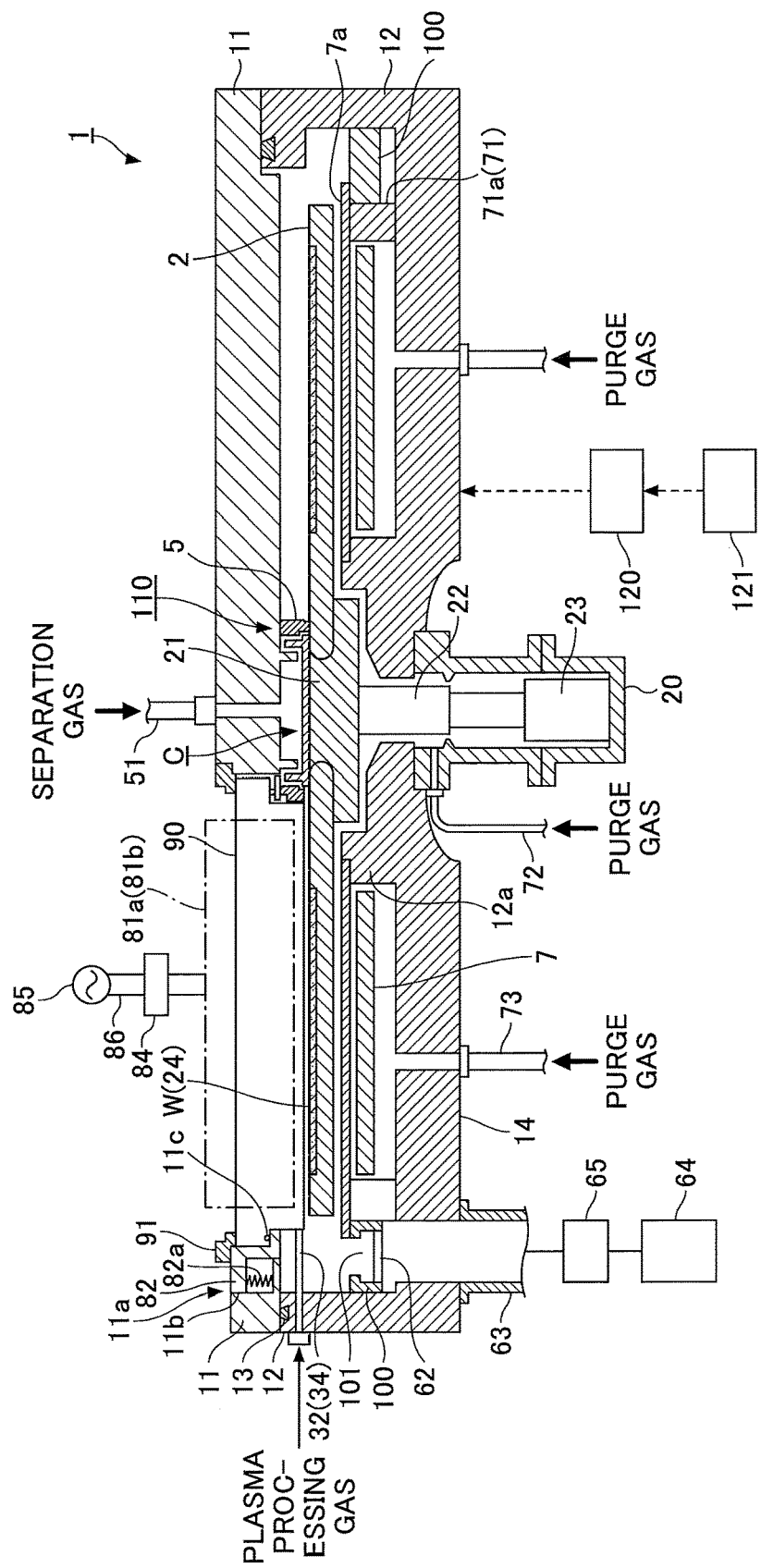
FIG. 1 is a schematic vertical cross-sectional view illustrating an example of a substrate processing apparatus according to an embodiment of the present invention.
Figure 2:
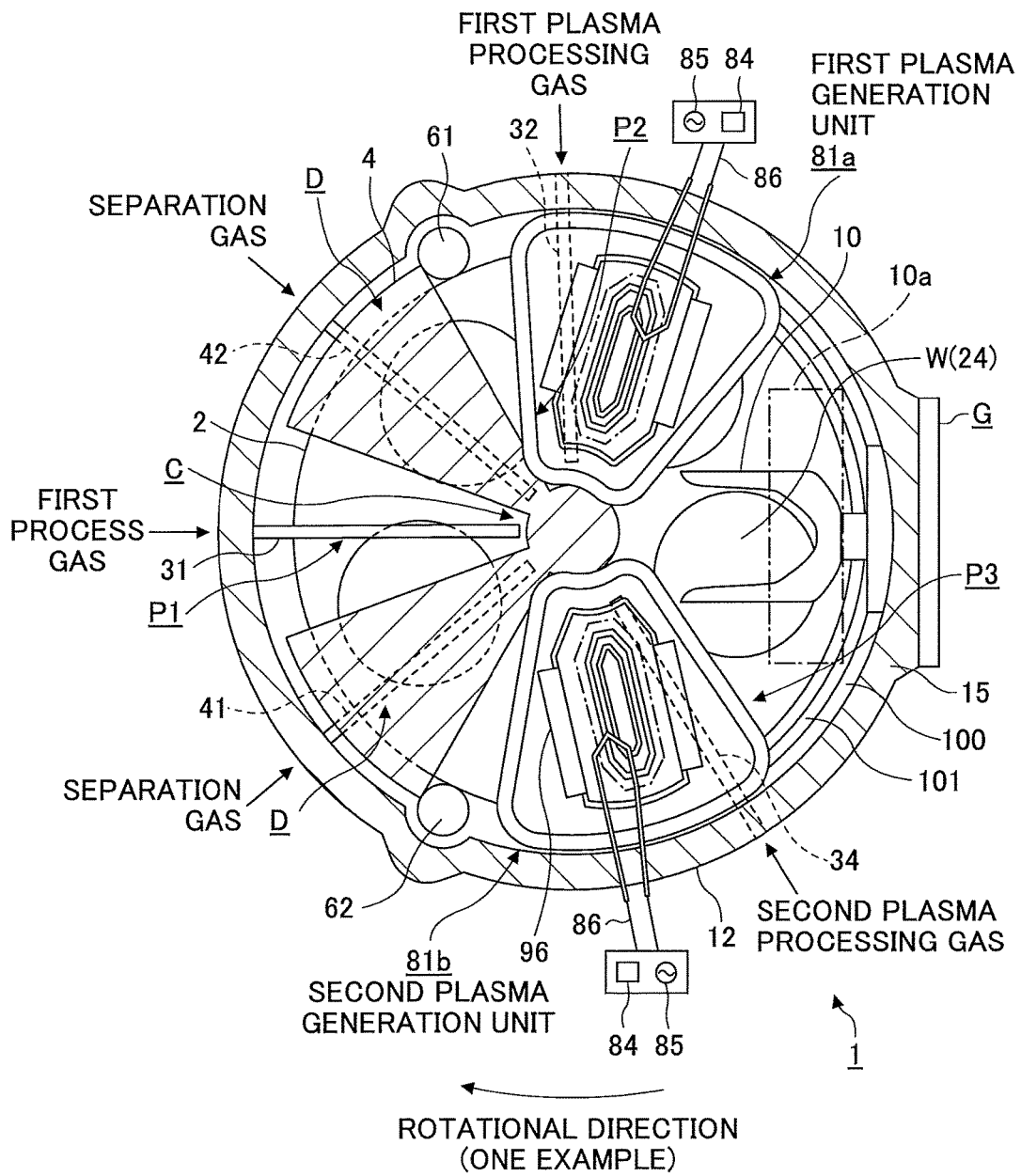
FIG. 2 is a schematic plan view illustrating an example of the substrate processing apparatus according to the embodiment of the present invention.

FIG. 1 is a schematic vertical cross-sectional view illustrating an example of the substrate processing apparatus of the embodiment. FIG. 2 is a schematic plan view illustrating an example of the substrate processing apparatus of the embodiment. Here, in FIG. 2, a depiction of a ceiling plate 11 is omitted for the purpose of illustration.

As shown in FIG. 1, the substrate processing apparatus of the embodiment includes a vacuum chamber 1 having an approximately circular planar shape and a turntable 2 provided in the vacuum chamber 1 and having its rotational center in common with the center of the vacuum chamber 1 to rotate a wafer W placed thereon.

The vacuum chamber 1 includes a ceiling plate (ceiling part) 11 provided in a position facing concave portions 24 of the turntable 2 described later and a chamber body 12. Moreover, a seal member 13 having a ring-like shape is provided in a periphery in an upper surface of the chamber body 12. The ceiling plate 11 is configured to be detachable and attachable from and to the chamber body 12. A diameter dimension (inner diameter dimension) of the vacuum chamber 1 when seen in a plan view is not limited, but can be, for example, set at about 1100 mm.

A separation gas supply pipe 51 is connected to a central part in an upper surface of the ceiling plate 11 and is further communicated with a central part of an upper surface side in the vacuum chamber 1 through a hole to supply a separation gas for preventing different process gases from mixing with each other in a central area C.

The turntable 2 is fixed to a core portion 21 having an approximately cylindrical shape at the central part, and is configured to be rotatable by a drive unit 23 in a clockwise fashion as illustrated in FIG. 2 as an example, around a rotational shaft 22 connected to a lower surface of the core portion 21 and extending in a vertical direction, which forms a vertical axis. The diameter dimension of the turntable 2 is not limited, but can be set at, for example, about 1000 mm.

The rotational shaft 22 and the drive unit 23 are accommodated in a casing body 20, and a flange portion at an upper surface side of the casing body 20 is hermetically attached to a lower surface of a bottom portion of the vacuum chamber 1. A purge gas supply pipe 72 for supplying nitrogen gas or the like as a purge gas (separation gas) to an area below the turntable 2.

A peripheral side of the core portion 21 in a bottom part 14 of the vacuum chamber 1 forms a protruding part 12a by being formed into a ring-like shape so as to come to close to the lower surface of the turntable 2.

As shown in FIG. 2, circular concave portions 24 are formed in a surface of the turntable 2 as a substrate receiving area to receive wafers W having a diameter dimension of, for example, 300 mm thereon. The concave portions 24 are provided at a plurality of locations, for example, at five locations along a rotational direction of the turntable 2. Each of the concave portions 24 has an inner diameter slightly larger than the diameter of the wafer W, more specifically, larger than the diameter of the wafer W by about 1 to 4 mm. Furthermore, the depth of each of the concave portions 24 is configured to be approximately equal to or greater than the thickness of the wafer W. Accordingly, when the wafer W is accommodated in the concave portion 24, the surface of the wafer W is as high as, or lower than a surface of the turntable 2 where the wafer W is not placed. Here, even when the depth of each of the concave portions 24 is greater than the thickness of the wafer W, the depth of each of the concave portion 24 is preferred to be equal to or smaller than about three times the thickness of the wafer W because too deep concave portions 24 may affect the film deposition.

Through holes not illustrated in the drawings are formed in a bottom surface of the concave portion 24 to allow, for example, three lifting pins described later to push up the wafer W from below and to lift the wafer W.

As illustrated in FIG. 2, for example, five nozzles 31, 32, 34, 41 and 42 each made of, for example, quartz are arranged in a radial fashion at intervals in the circumferential direction of the vacuum chamber 1 at respective positions opposite to a passing area of the concave portions 24. Each of the nozzles 31, 32, 34, 41 and 42 is arranged between the turntable 2 and the ceiling plate 11. These nozzles 31, 32, 34, 41 and 42 are each installed, for example, so as to horizontally extend facing the wafer W from an outer peripheral wall of the vacuum chamber 1 toward the central area C.

In the example illustrated in FIG. 2, a first process gas nozzle 31, a separation gas nozzle 42, a first plasma processing gas nozzle 32, a second plasma processing gas nozzle 34, a second plasma processing gas nozzle 34 and a separation gas nozzle 41 are arranged in a clockwise fashion (in the rotational direction of the turntable 2) in this order. However, the substrate processing apparatus of the embodiments is not limited to this form, and the turntable 2 may rotate in a counterclockwise fashion. In this case, the first process gas nozzle 31, the separation gas nozzle 42, the first plasma processing gas nozzle 32, the second plasma processing gas nozzle 34 and the separation gas nozzle 41 are arranged in this order in the counterclockwise fashion.

As illustrated in FIG. 2, plasma generation units 81a and 81b are provided above the first plasma processing gas nozzle 32 and the second plasma processing gas nozzle 34, respectively, to convert plasma processing gases discharged from the respective plasma processing gas nozzles 32 and 34. A description is given later of the plasma generation units 81a and 81b.

Here, in the embodiment, although an example of arranging a single nozzle in each process area is illustrated, a configuration of providing a plurality of nozzles in each process area is also possible. For example, the first plasma processing gas nozzle 32 may be constituted of a plurality of plasma processing gas nozzles, each of which is configured to supply argon (Ar) gas, ammonia ($NH_3$) gas, hydrogen ($H_2$) gas or the like, or may be constituted of only a single plasma processing gas nozzle configured to supply a mixed gas of argon gas, ammonia gas and hydrogen gas.

The first process gas nozzle 31 forms a first process gas supply part. Moreover, the first plasma processing gas nozzle 32 forms a first plasma processing gas supply part, and the second plasma processing gas nozzle 34 forms a second plasma processing gas supply part. Furthermore, each of the separation gas nozzles 41 and 42 forms a separation gas supply part.

Each of the nozzles 31, 32, 34, 41 and 42 is connected to each gas supply source not illustrated in the drawings through a flow regulating valve.

A silicon-containing gas may be used as an example of the first process gas supplied from the first process gas nozzle 31 such as DCS [dichlorosilane], HCD [hexachlorodisilane], DIPAS [diisopropylamino-silane], 3DMAS [tris(dimethylamino)silane] gas, BTBAS [bis(tertiary-butyl-amino)silane] or the like. Also, a metal-containing gas may be used as an example of the first process gas supplied from the first process gas nozzle 31 such as $TiCl_4$ [titanium tetrachloride], Ti (MPD) $(THD)_2$ [titanium methylpentanedionato, bis(tetramethylheptanedionato)], TMA [trimethylaluminium], TEMAZ [Tetrakis(ethylmethylamino)zirconium], TEMHF [tetrakis (ethylmethylamino)hafnium], $Sr(THD)_2$ [strontium bis(tetramethylheptanedionato)] or the like.

The plasma processing gases supplied from the first plasma processing gas nozzle 32 and the second plasma processing gas nozzle 34 can be properly selected depending on intended purpose of the plasma. For example, argon gas or helium (He) gas mainly used for plasma generation, and a mixed gas of ammonia gas and hydrogen gas for nitrizing the first process gas adsorbing on the wafer W and modifying the obtained nitrized film are cited as examples. Here, the plasma processing gases discharged from the first plasma processing gas nozzle 32 and the second plasma processing gas nozzle 34 may be the same gas species, or may be different gas species from each other. Each of the plasma processing gases can be selected depending on a desired plasma treatment.

For example, nitrogen ($N_2$) gas or the like is cited as an example of the separation gas supplied from the separation gas nozzles 41 and 42.

As discussed above, in the example illustrated in FIG. 2, the first process gas nozzle 31, the separation gas nozzle 42, the first plasma processing gas nozzle 32, the second plasma processing gas nozzle 34 and the separation gas nozzle 41 are arranged in this order in a clockwise fashion (in the rotational direction of the turntable 2). In other words, in an actual process of the wafer W, the wafer W to which the first process gas has been supplied from the first process gas nozzle 31 is sequentially exposed to the separation gas from the separation gas nozzle 42, the plasma processing gas from the first plasma processing gas nozzle 32, the plasma processing gas from the second plasma processing gas nozzle 34, and the separation gas from the separation gas nozzle 41 in this order.

Gas discharge holes 33 for discharging each of the above-mentioned gases are formed in each lower surface (the surface facing the turntable 2) of the gas nozzles 31, 32, 34, 41 and 42 along a radial direction of the turntable 2 at a plurality of locations, for example, at regular intervals. Each of the nozzles 31, 32, 34, 41 and 42 is arranged so that a distance between a lower end surface of each of the nozzles 31, 32, 34, 41 and 42 and an upper surface of the turntable 2 is set at, for example, about 1 to 5 mm.

An area under the first process gas nozzle 31 is a first process area P1 to allow the first process gas to adsorb on the wafer W. An area under the first plasma processing gas nozzle 32 is a second process area P2 to treat a thin film on the wafer W by first plasma, and an area under the second plasma processing gas nozzle 34 is a third process area P3 to treat the thin film on the wafer W by second plasma.

Figure 3:
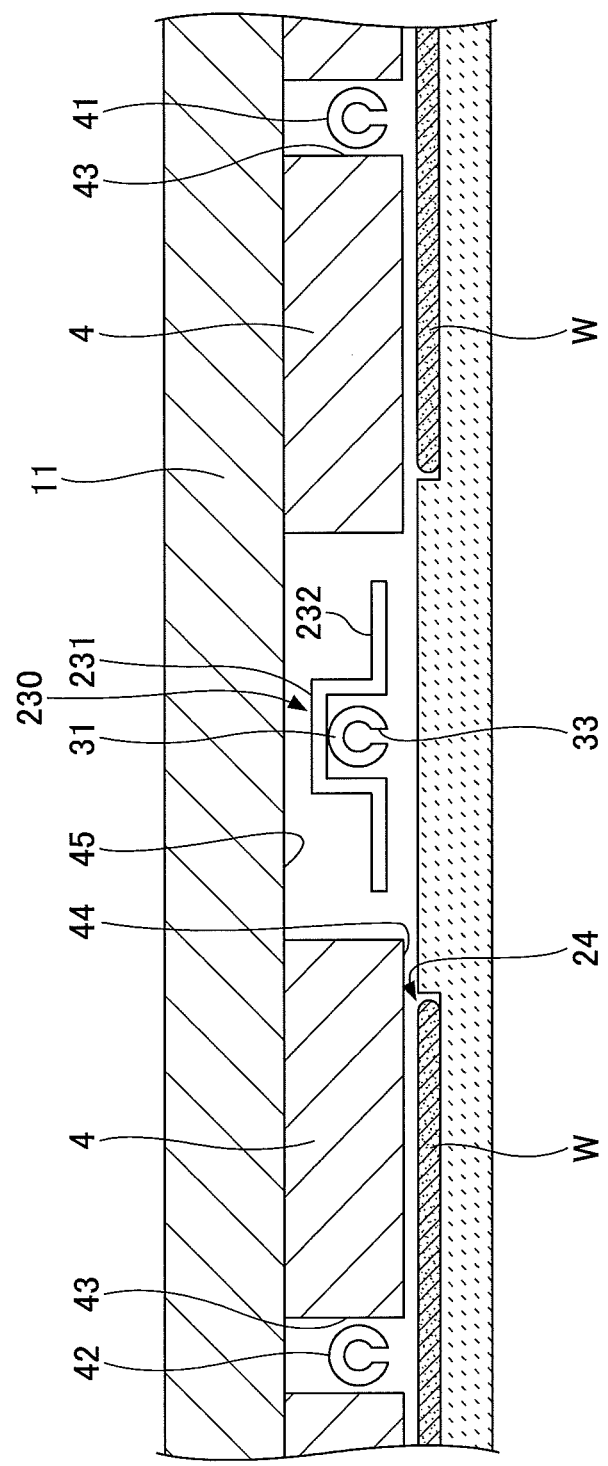
FIG. 3 is a cross-sectional view cut along a concentric circle of a turntable in the plasma processing apparatus according to the embodiment of the present invention.

FIG. 3 illustrates a cross-sectional view cut along a concentric circle of the turntable 2 of the film deposition apparatus of the embodiment. Here, FIG. 3 illustrates the cross-sectional view from one of the separation area D to the other separation area D by way of the first process area P1.

As shown in FIG. 3, approximately sectorial convex portions 4 are provided on the ceiling plate 11 of the vacuum chamber 1 in the separation areas D. Flat low ceiling surfaces 44 (first ceiling surfaces) that are lower surfaces of the convex portions 4 and ceiling surfaces 45 (second ceiling surfaces) that are higher than the ceiling surfaces 44 provided on both sides of the ceiling surfaces 44 in a circumferential direction, are formed in the vacuum chamber 1.

As illustrated in FIG. 2, the convex portions 4 forming the ceiling surfaces 44 have a sectorial planar shape whose apexes are cut into an arc-like shape. Moreover, each of the convex portions 4 has a groove portion 43 formed so as to extend in the radial direction in the center in the circumferential direction, and each of the separation gas nozzles 41 and 42 is accommodated in the groove portion 43. Here, a periphery of each of the convex portions 4 (a location on the peripheral side of the vacuum chamber 1) is bent into a L-shaped form so as to face an outer end surface of the turntable 2 and to be located slightly apart from the chamber body 12 in order to prevent each of the process gas from mixing with each other.

As illustrated in FIG. 3, a nozzle cover 230 is provided on the upper side of the first process gas nozzle 31 in order to cause the first process gas to flow along the wafer W and so as to cause the separation gas to flow through a location close to the ceiling plate 11 of the vacuum chamber 1 while flowing away from the neighborhood of the wafer W. As illustrated in FIG. 3, the nozzle cover 230 includes an approximately box-shaped cover body 231 whose lower surface side is open to accommodate the first process gas nozzle 31 and current plates 232 having a plate-like shape and connected to the lower open ends of the cover body 231 on both upstream and downstream sides in the rotational direction of the turntable 2. Here, a side wall surface of the cover body 231 on the rotational center side of the turntable 2 extends toward the turntable 2 (i.e., downward) so as to face a tip of the first process gas nozzle 31. In addition, the side wall surface of the cover body 231 on the peripheral side of the turntable 2 is cut off so as not to interfere with the first process gas nozzle 31.

Next, a detailed description is given below of the first plasma generation unit 81a and the second plasma generation unit 81b provided above the first and second plasma processing gas nozzles 32 and 34, respectively. Here, in the embodiment, although each of the first plasma generation unit 81a and the second plasma generation unit 81b can perform an independent plasma treatment, each specific configuration can be similar to each other.

Figure 4:
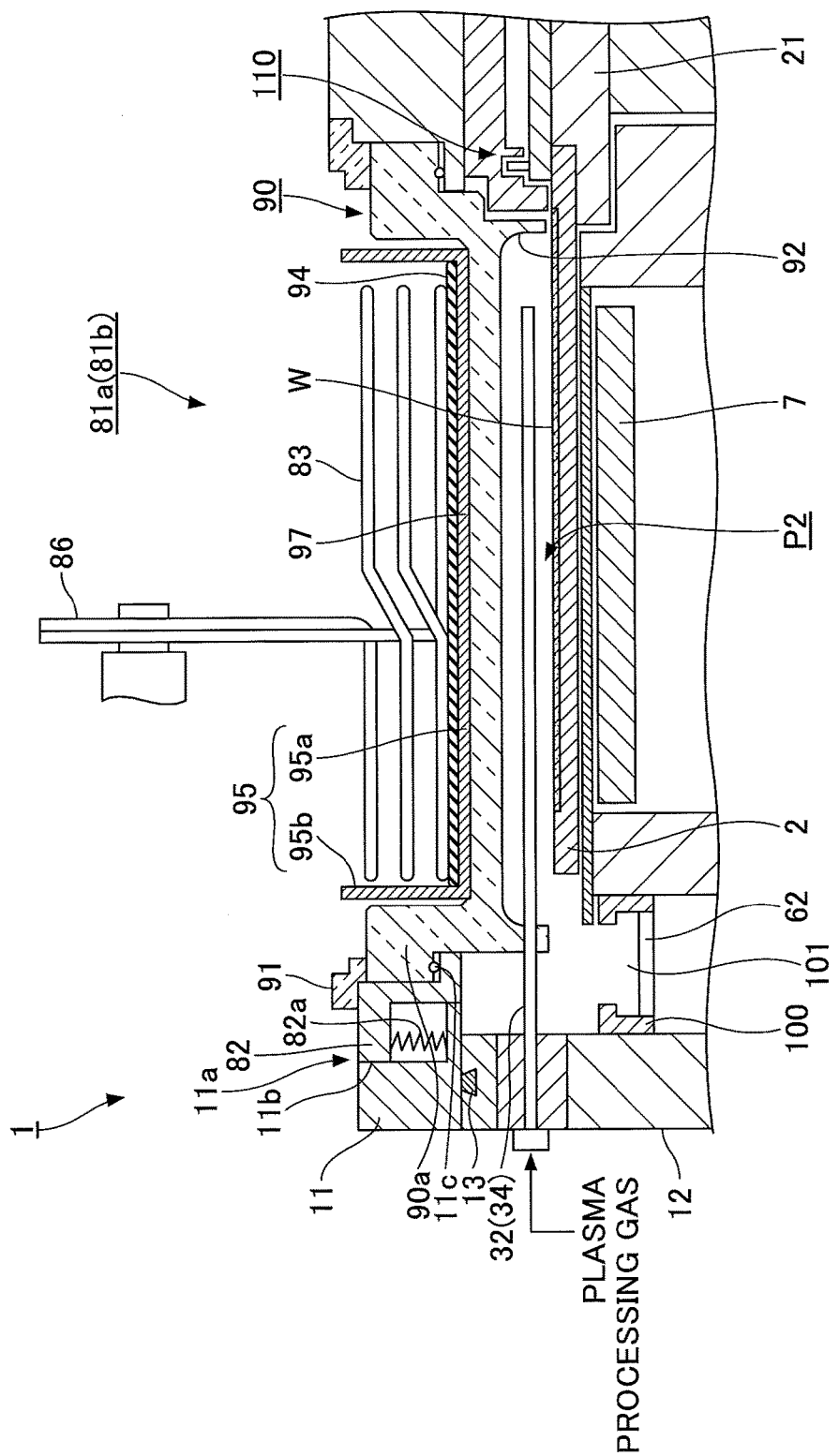
FIG. 4 is a vertical cross-sectional view illustrating an example of a plasma generation unit according to the embodiment of the present invention.
Figure 5:
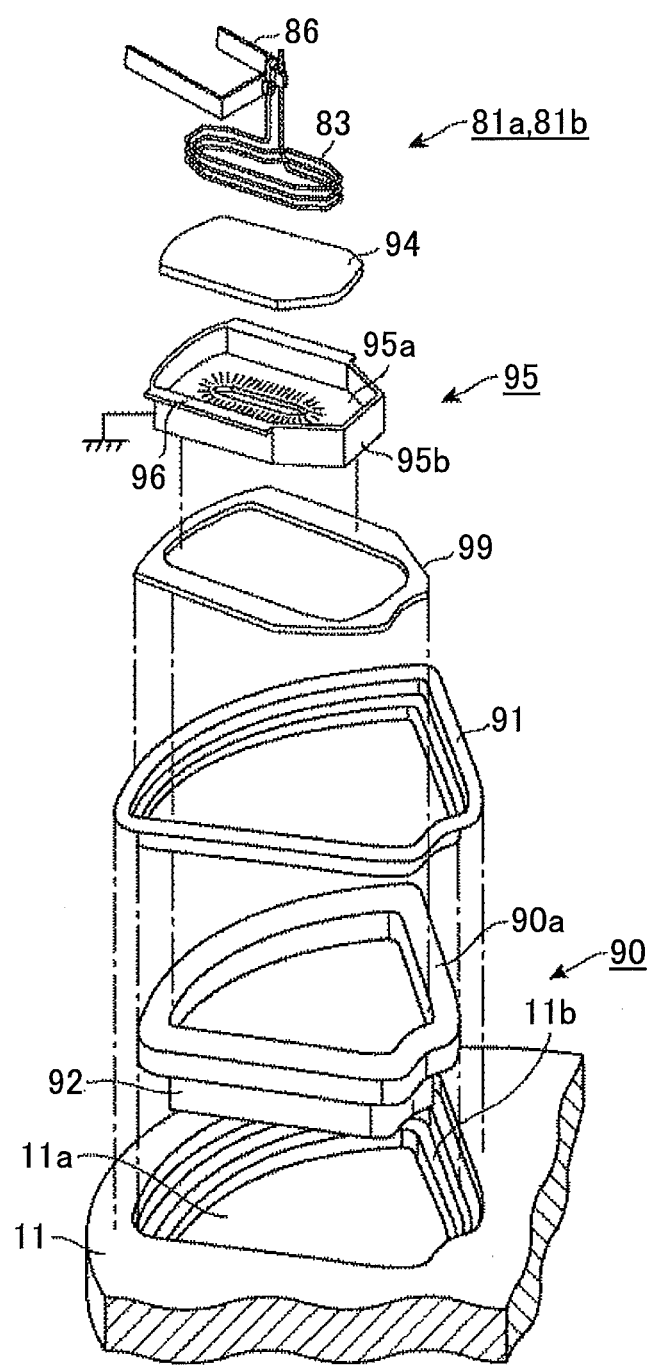
FIG. 5 is an exploded perspective view illustrating an example of the plasma generation unit according to the embodiment of the present invention.
Figure 6:
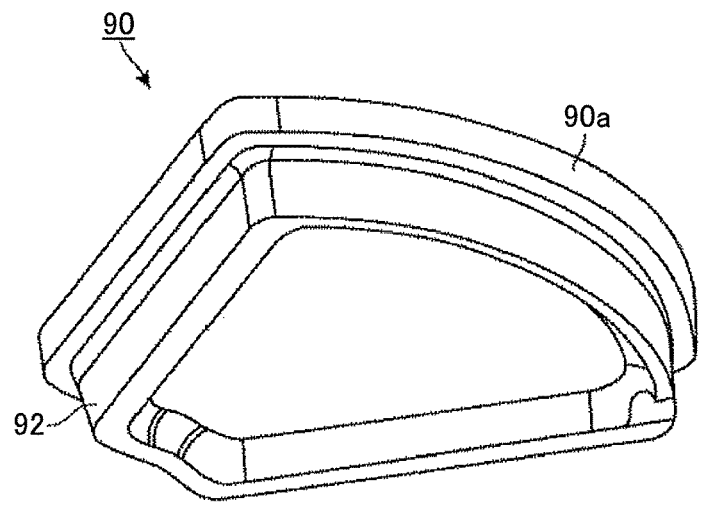
FIG. 6 is a perspective view illustrating an example of a housing provided in the plasma generation unit according to the embodiment of the present invention.

FIG. 4 illustrates a vertical cross-sectional view of an example of the plasma generation units 81a and 81b of the embodiment. Also, FIG. 5 illustrates an exploded perspective view of an example of the plasma generation units 81a and 81b of the embodiment. Furthermore, FIG. 6 illustrates a perspective view of an example of a housing provided in the plasma generation units 81a and 81b of the embodiment.

The plasma generation units 81a and 81b are configured to wind an antenna 83 constituted of a metal wire or the like, for example, triply around the vertical axis. Moreover, as illustrated in FIG. 2, each of the plasma generation unit 81a and 81b is arranged so as to surround a band area extending in the radial direction of the turntable 2 when seen in a plan view and to cross the diameter of the wafer W on the turntable 2.

The antenna 83 is, for example, connected to a high frequency power source 85 having a frequency of 13.56 MHz and an output power of 5000 W by way of a matching box 84. Then, the antenna 83 is provided to be hermetically separated from an inner area of the vacuum chamber 1. Here, a connection electrode 86 is provided to electrically connect the antenna 83 with the matching box 84 and the high frequency power source 85.

As illustrated in FIGS. 4 and 5, an opening 11a having an approximately sectorial shape when seen in a plan view is formed in the ceiling plate 11 above the first plasma processing gas nozzle 32.

As illustrated in FIG. 4, an annular member 82 is hermetically provided in the opening 11a along the verge of the opening 11a. The housing 90 described later is hermetically provided on the inner surface side of the annular member 82. In other words, the annular member 82 is hermetically provided at a position where the outer peripheral side of the annular member 82 faces the inner surface 11b of the opening 11a in the ceiling plate 11 and the inner peripheral side of the annular member 82 faces a flange part 90a of the housing 90 described later. The housing 90 made of, for example, a derivative of quartz is provided in the opening 11a through the annular member 82 in order to arrange the antenna 83 at a position lower than the ceiling plate 11.

Moreover, as illustrated in FIG. 4, the annular member 82 includes a bellows 82a expandable in the vertical direction. Furthermore, the plasma generation units 81a and 81b are formed to be able to move up and down independently of each other by a drive mechanism (elevating mechanism) not illustrated in the drawings such as an electric actuator or the like. By causing the bellows 82a to extend and contract in response to the rise and fall of the plasma generation units 81a and 81b, each distance between each of the plasma generation units 81a and 81b and the wafer W (i.e., turntable 2) (which may be called a distance of a plasma generation space) during the plasma treatment can be changed.

As illustrated in FIG. 6, the casing 90 is configured to have a peripheral part horizontally extending along the circumferential direction on the upper side so as to form the flange part 90a and a central part getting recessed inward toward the inner area of the vacuum chamber 1 when seen in a plan view.

The housing 90 is arranged to cross the diameter of the wafer W in the radial direction of the turntable 2 when the wafer W is located under the housing 90. Here, as illustrated in FIG. 4, a seal member 11c such as an O-ring or the like is provided between the annular member 82 and the ceiling plate 11.

An internal atmosphere of the vacuum chamber 1 is sealed by the annular member 82 and the housing 90. More specifically, the annular member 82 and the housing 90 are set in the opening 11a, and then the housing 90 is pressed downward through the whole circumference by a pressing member 91 formed into a frame-like shape along the contact portion of the annular member 82 and the housing 90. Furthermore, the pressing member 91 is fixed to the ceiling plate 11 by volts and the like not illustrated in the drawings. This causes the internal atmosphere of the vacuum chamber 1 to be sealed. Here, in FIG. 5, a depiction of the annular member 82 is omitted for simplification.

As illustrated in FIG. 6, a projection portion 92 vertically extending toward the turntable 2 is formed in a lower surface of the housing 90 so as to surround each of the process areas P2 and P3 under the housing 90 along each circumferential direction thereof. Then, the first plasma processing gas nozzle 32 and the second plasma processing gas nozzle 34 are accommodated in an area surrounded by an inner circumferential surface of the projection portion 92, the lower surface of the housing 90 and the upper surface of the turntable 2. Here, the projection portion 92 at the base end portion (the inner wall side of the vacuum chamber 1) of each of the first plasma processing gas nozzle 32 and the second plasma processing gas nozzle 34 is cut off so as to be formed into an approximately arc-like form along each of the first plasma processing gas nozzle 32 and the second plasma processing gas nozzle 34.

As illustrated in FIG. 4, the projection portion 92 is formed on the lower side of the housing 90 along the circumferential direction thereof. The seal member 11c is not exposed to the plasma due to the projection portion 92, and that is to say, is separated from the plasma generation space. Because of this, even if the plasma is likely to diffuse, for example, to the seal member 11c side, because the plasma goes toward the seal member 11c byway of the lower side of the projection portion 92, the plasma becomes inactivated before reaching the seal member 11c.

A grounded Faraday shield 95 that is formed so as to approximately fit along an inner shape of the housing 90 and is made of a conductive plate-like body, for example, a metal plate such as a copper plate and the like, is installed in the housing 90. The Faraday shield 95 includes a horizontal surface 95a horizontally formed so as to be along the bottom surface of the housing 90 and a vertical surface 95b extending upward from the outer edge of the horizontal surface 95a through the whole circumference, and may be configured to be approximately hexagon when seen in a plan view.

Figure 7:
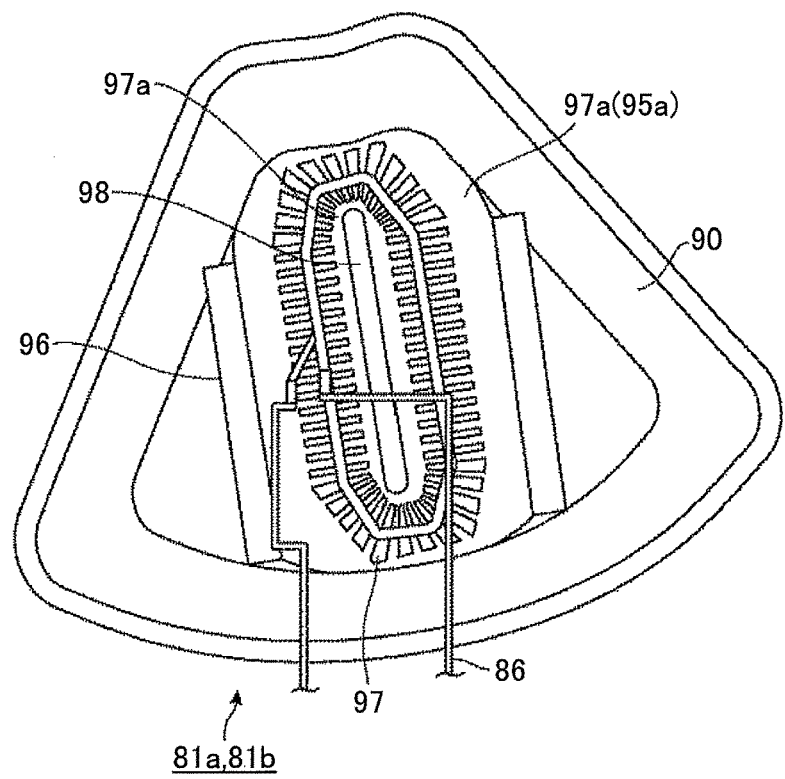
FIG. 7 is a plan view illustrating an example of the plasma generation unit according to the embodiment of the present invention.
Figure 8:
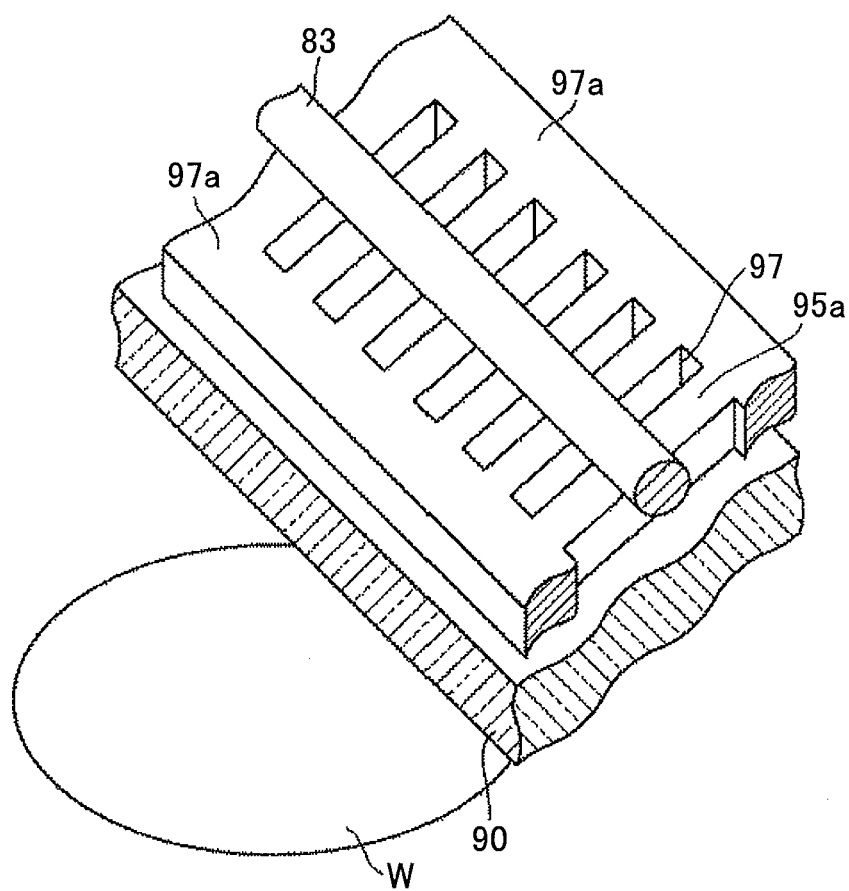
FIG. 8 is a perspective view illustrating a part of a Faraday shield provided in the plasma generation unit according to the embodiment of the present invention.

FIG. 7 illustrates a plan view of an example of the plasma generation unit according to the embodiment, and FIG. 8 illustrates a perspective view of a part of the Faraday shield provided in the plasma generation unit according to the embodiment.

Upper end edges of the Faraday shield 95 on the right side and the left side extend rightward and leftward, respectively, when seen from the rotational center of the turntable 2 horizontally, and form supports 96. As illustrated in FIG. 5, a frame body 99 is provided between the Faraday shield 95 and the housing 90 to support the support 96 from below and so as to be supported by the flange part 90a of the housing 90 on the central area C and the outer periphery of the turntable 2.

When an electric field generated by the antenna 83 reaches the wafer W, a pattern (electrical wiring and the like) formed inside the wafer W may be damaged. Because of this, as illustrated in FIG. 8, many slits 97 are formed in the horizontal surface 95a in order to prevent an electric field component of the electric field and a magnetic field (i.e., an electromagnetic field) generated by the antenna 83 from going toward the wafer W located below and to allow the magnetic field to reach the wafer W.

As illustrated in FIGS. 7 and 8, the slits 97 are formed under the antenna 83 along the circumferential direction so as to extend in a direction perpendicular to a winding direction of the antenna 83. Here, the slits 97 are formed to have a width dimension equal to or less than about $1/10000$ of a wavelength of the high frequency power supplied to the antenna 83. Moreover, electrically conducting paths 97a made of a grounded electric conductor and the like are arranged on one end and the other end in a lengthwise direction of each of the slits 97a so as to stop open ends of the slits 97a. An opening 98 is formed in an area out of the area where the slits 97 are formed in the Faraday shield 95, that is to say, at the central side of the area where the antenna 83 is wound around to be able to observe a light emitting state of the plasma therethrough. Here, in FIG. 2, the slits 97 are omitted for simplicity, and an example of the slit formation area is expressed by alternate long and short dash lines.

As illustrated in FIG. 5, an insulating plate 94 made of quartz and the like having a thickness dimension of, for example, about 2 mm, is stacked on the horizontal surface 95a of each of the Faraday shields 95 in order to ensure insulation properties from the plasma generation units 81a and 81b placed on each of the Faraday shields 95. In other words, each of the plasma generation units 81a and 81b is arranged so as to face the inside of the vacuum chamber 1 (the wafer W on the turntable 2) through the housing 90, the Faraday shield 95 and the insulating plate 94.

A description is given below of other components of the substrate processing apparatus of the embodiment again.

As illustrated in FIG. 2, a side ring 100 that forms a cover body is arranged at a position slightly lower than the turntable 2 and outer edge side of the turntable 2. Exhaust openings 61 and 62 are formed in an upper surface of the side ring 100 at two locations apart from each other in the circumferential direction. In other words, two exhaust ports are formed in a bottom surface of the vacuum chamber 1, and the exhaust openings 61 and 62 are formed at locations corresponding to the exhaust ports in the side ring 100.

In the present specification, one of the exhaust openings 61 and 62 is called a first opening 61 and the other of the exhaust openings 61 and 62 is called a second opening 62. Here, the first exhaust opening 61 is formed between the separation gas nozzle 42 and the first plasma generation unit 81a located on the downstream side of the separation gas nozzle 42 in the rotational direction of the turntable 2. Furthermore, the second exhaust opening 62 is formed between the second plasma generation unit 81b and the separation area D on the downstream side of the plasma generation unit 81b in the rotational direction of the turntable 2.

The first exhaust opening 61 is to evacuate the first process gas and the separation gas, and the second exhaust opening 62 is to evacuate the plasma processing gas and the separation gas. Each of the first exhaust opening 61 and the second exhaust opening 62 is, as shown in FIG. 1, connected to an evacuation mechanism such as a vacuum pump 64 through an evacuation pipe 63 including a pressure controller 65 such as a butterfly valve.

As described above, because the housings 90 are arranged from the central area C side to the outer peripheral side, a gas flowing from the upstream side in the rotational direction of the turntable 2 to the plasma treatment area P2 and P3 may be blocked from going to the evacuation opening 62 by the housings 90. In response to this, a groove-like gas flow passage 101 (see FIGS. 1 and 2) is formed in the upper surface of the side ring 100 on the outer edge side of the housing 90 to allow the gas to flow therethrough.

As shown in FIG. 1, in the center portion on the lower surface of the ceiling plate 11, a protrusion portion 5 is provided that is formed into an approximately ring-like shape along the circumferential direction continuing from the central area C side of the convex portion 4 so as to have a lower surface formed as high as the lower surface of the convex portion 4 (ceiling surface 44). A labyrinth structure 110 is provided closer to the rotational center side of the turntable 2 than the protrusion portion 5 and above the core portion 21 to suppress the various gases from mixing with each other in the center area C.

As discussed above, because the housings 90 are formed at the location close to the central area C, the core portion 21 supporting the central portion of the turntable 2 is formed at the rotational center side so that a location above the turntable 2 avoids the housing 90. Due to this, the various gases are more likely to mix with each other at the central area C side than at the outer peripheral side. Hence, by forming the labyrinth structure 110 above the core portion 21, a flow path can be made longer to be able to prevent the gases from mixing with each other.

More specifically, the labyrinth structure 110 has a wall part vertically extending from the turntable 2 toward the ceiling plate 11 and a wall part vertically extending from the ceiling plate 11 toward the turntable 2 that are formed along the circumferential direction, respectively, and are arranged alternately in the radial direction of the turntable 2. In the labyrinth structure 110, for example, a first process gas discharged from the first process gas nozzle 31 and heading for the central area C needs to go through the labyrinth structure 110. Due to this, the first process gas decreases in speed with the decreasing the distance from the central area C and becomes unlikely to diffuse. As a result, the first process gas is pushed back by the separation gas supplied to the central area C before reaching the central area C. Moreover, other gases likely to head for the central area C are difficult to reach the central area C by the labyrinth structure 110 in a similar way. This prevents the process gases from mixing with each other in the central area C.

On the other hand, the separation gas supplied from the separation gas supply pipe 51 is likely to diffuse swiftly in the circumferential direction at first, but decreases in speed as going through the labyrinth structure 110. In this case, nitrogen gas is likely to intrude into a very narrow area such as a gap between the turntable 2 and the projection portion 92, but flows to a relatively large area such as an area where the transfer arm 10 moves in and out of the vacuum chamber 1 because the labyrinth structure 110 decreases the flowing speed thereof. Because of this, nitrogen gas is prevented from flowing into a space under the housing 90.

As illustrated in FIG. 1, a heater unit 7 that is a heating mechanism is provided in a space between the turntable 2 and the bottom part 14 of the vacuum chamber 1. The heater unit 7 is configured to be able to heat the wafer W on the turntable 2 through the turntable 2 up to, for example, a range from room temperature to about 760 degrees C. Furthermore, as illustrated in FIG. 1, a side cover member 71a is provided on a lateral side of the heater unit 7, and an upper covering member 7a is provided so as to cover the heater unit 7 from above. In addition, purge gas supply pipes 73 for purging a space in which the heater unit 7 is provided are provided in the bottom part 14 of the vacuum chamber 1 under the heater unit 7 at multiple locations along the circumferential direction.

As illustrated in FIG. 2, a transfer opening 15 is provided in the side wall of the vacuum chamber 1 to transfer the wafer W between a transfer arm 10 and the turntable 2. The transfer opening 15 is configured to be hermetically openable and closable by a gate valve G. Moreover, a camera unit 10a is provided above the ceiling plate 11 in the area where the transfer arm moves in and out of the vacuum chamber 10a in order to detect a peripheral part of the wafer W. The camera unit 10a is used to detect, for example, presence or absence of the wafer W on the transfer arm 10, a positional shift of the wafer W placed on the turntable 2 and a positional shift of the wafer W on the transfer arm 10. The camera unit 10a is configured to have a field of view wide enough to cover a diameter dimension of the wafer W.

The wafer W is transferred between the concave portion 24 of the turntable 2 and the transfer arm 10 at a position where the concave portion 24 of the turntable 2 faces the transfer opening 15. Accordingly, lift pins and an elevating mechanism that are not illustrated in the drawings are provided at a position under the turntable 2 corresponding to the transferring position to lift the wafer W from the back surface by penetrating through the concave portion 24.

Moreover, as illustrated in FIG. 1, a control unit 120 constituted of a computer to control operation of the whole apparatus is provided in the substrate processing apparatus of the embodiment. A program to implement the substrate process described later is stored in a memory of the control unit 120. This memory stores the program to perform the substrate process described later. This program is constituted of instructions of step groups to cause the apparatus to implement operations described later, and is installed into the control unit 120 from a memory unit 121 that is a storage medium such as a hard disk, a compact disc, a magnetic optical disk, a memory card and a flexible disk.

[Method for Processing a Substrate]

Next, a description is given below of a method for processing a substrate using the substrate processing apparatus according to an embodiment of the present invention.

In the ALD method using a turntable type substrate processing apparatus utilizing plasma, in general, film deposition of a predetermined film and the film quality enhancement thereof are performed at a relatively low temperature by utilizing the energy of radicals and ions generated by the plasma after causing a predetermined process gas to adsorb on a wafer W. However, when depositing a nitride film such as a silicon nitride film on a wafer W, although the adsorption of the process gas on the wafer W is readily performed on a relatively short time, nitriding the adsorbed process gas needs a large amount of nitriding gas and a long reaction time. In the turntable type substrate processing apparatus, because there are limitations of a number of plasma generation units capable of being installed and a range of plasma treatment area (which depends on the electrode size and the like thereof) due to the apparatus size and the apparatus cost, a desired film quality needs to be acquired by the limited number of plasma generation units and the limited plasma treatment area with desired productivity.

Moreover, in the film deposition process, a phenomenon is caused that a film deposition rate varies depending on a surface area of an electrical wiring pattern preliminarily formed in the wafer W (i.e., loading effect). In particular, in order to respond to a demand of miniaturization of the electrical wiring pattern of semiconductor devices in recent years, a substrate processing apparatus is needed that can prevent the generation of the loading effect and can form a thin film having a desired film quality. It is known that the loading effect in a reaction system for forming a nitride film is likely to occur when a pressure of the nitriding part is high and is unlikely to occur as the pressure of the nitriding part becomes low. However, in the turntable type substrate processing apparatus, when the pressure of the nitriding part is reduced, a pressure of an adsorption part where the adsorption of a process gas occurs decreases at the same time, which decreases an adsorption efficiency of the process gas and the productivity, and increases the productive cost. Furthermore, because increasing the vacuum pump in size, installing a high vacuum pump and the like are needed, the apparatus cost increases.

Therefore, the substrate processing method according to the embodiment is implemented by using a substrate processing apparatus including:

a vacuum chamber;

a turntable having a substrate receiving portion to receive a substrate on a surface thereof provided in the vacuum chamber;

a first process gas supply unit configured to supply a first process gas that adsorbs to a surface of the substrate;

a first plasma processing gas supply unit and a second plasma processing gas supply unit configured to supply a first plasma processing gas and a second plasma processing gas to the surface of the substrate, respectively;

a first separation gas supply unit configured to supply a separation gas to separate the first plasma processing gas from the first process gas and;

a second separation gas supply unit configured to supply the separation gas to separate the second plasma processing gas from the first process gas; and a first plasma generation unit and a second plasma generation unit configured to convert the first plasma processing gas and the second plasma processing gas to first plasma and second plasma, respectively, wherein the first process gas supply unit, the first separation gas supply unit, the first plasma processing gas supply unit, the second plasma processing gas supply unit and the second separation gas supply unit are arranged in this order in a rotational direction of the turntable.

More specifically, a method for processing a substrate of the embodiments includes steps of:

supplying the first process gas to the substrate (S100);

supplying the separation gas to the substrate to which the first process gas was supplied (S110);

supplying the first plasma processing gas to the substrate to which the separation gas was supplied in a first state in which a distance between the first plasma generation unit and the turntable is a first distance (S120);

supplying the second plasma processing gas to the substrate to which the first plasma processing gas was supplied in a second state in which a distance between the second plasma generation unit and the turntable is a second distance shorter than the first distance (S130); and supplying the separation gas to the substrate to which the second plasma processing gas was supplied.

The method for processing the substrate according to the embodiments causes the substrate to pass a first plasma treatment area in which the distance between the first plasma generation unit and the turntable is the first distance, and subsequently to pass a second plasma treatment area in which the distance between the second plasma generation unit and the turntable is the second distance shorter than the first distance. In other words, the substrate is caused to pass an area in which ion energy is low and a radical concentration is low (second process area P2) and then to pass an area in which the ion energy is high and the radical concentration is high (third process area P3). This enables the generation of the loading effect to be prevented, and makes it possible to form a thin film having a desired film quality.

A detailed description is given below of each of the steps starting from the carry-in of the wafers W by citing specified embodiments.

To begin with, in carrying wafers W in the vacuum chamber 1, the gate valve G is opened. Then, the wafers W are placed on the turntable 2 by the transfer arm 10 through the transfer opening 15 while rotating the turntable 2 intermittently.

Next, the gate valve G is closed and the wafers W are heated to a predetermined temperature by the heater unit 7. Subsequently, the first process gas is discharged from the first process gas nozzle 31 at a predetermined flow rate, and plasma processing gases are supplied from the first plasma processing gas nozzle 32 and the second plasma processing gas nozzle 34 at predetermined flow rates, respectively.

Next, a distance between the first plasma generation unit 81a and the turntable 2 is set at a predetermined first distance. Then, a distance between the second plasma generation unit 81b and the turntable 2 is set at a second distance shorter than the first distance.

The inside of the vacuum chamber 1 is adjusted to a predetermined pressure by the pressure controller 65. The plasma generation units 81a and 81b supply high frequency power of predetermined outputs to antennas 83 thereof, respectively.

The first process gas adsorbs on each surface of the wafers W in the first process area P1 by the rotation of the turntable 2 (S100). The wafers W on which the first process gas adsorbs pass the separation area D by the rotation of the turntable 2 (S110). In the separation area D, the separation gas is supplied to each of the surfaces of the wafers W, and unnecessary physically absorbed materials with respect to the first process gas are removed.

The wafers W subsequently pass the second process area P2 by the rotation of the turntable 2 (S120). In the second process area P2, the first process gas is nitrided by plasma of the plasma processing gas supplied from the first plasma processing gas nozzle 32, and the formed nitride film is treated to modify the quality thereof.

In general, ions and radicals are known as active species (precursors) generated by plasma converted from a plasma processing gas. The ions mainly contribute to a modification treatment of a nitride film, and the radicals mainly contribute to a deposition process of a nitride film. Moreover, it is known that the ions have shorter life than the radicals and that the ion energy reaching the wafers W widely decreases by making the distances between the plasma generation units 81a and 81b and the turntable 2 longer.

Here, in the second process area P2, the distance between the first plasma generation unit 81a and the turntable 2 is set at the first distance longer than the second distance described later (see S120). In the second process area P2, the ions reaching the wafers W widely decrease due to the relatively long first distance, and the radicals are mainly supplied to the wafers W. In other words, in the second process area P2, the first process gas on the wafers W is nitrided (initialized) by the first plasma having a relatively low ion energy, and one or more molecular layers of the nitride film that are a component of the thin film are deposited. Furthermore, the deposited nitride film is treated by the second plasma to modify the quality thereof.

In addition, in the initial stage of the film deposition process, when plasma whose precursor has a significant influence on the wafers W is used such as plasma having great ion energy, the wafers W may be nitrided in themselves. In terms of this, in the process performed in the second process area P2, to begin with, the plasma treatment using plasma having low ion energy is preferred to be performed.

The first distance is not limited, but is preferred to be set in a range from 45 to 120 mm in terms of efficiently depositing the nitride film on the wafers W by using the plasma having relatively low ion energy.

Next, the wafers W having passed the second process area P2 pass the third process area P3 by the rotation of the turntable 2 (S130). In the third process area P3, the first process gas is nitrided by the plasma of the plasma processing gas supplied from the second plasma processing gas nozzle 34 as well as the second process area P2, thereby treating the deposited nitride film for modification treatment.

Here, in the third process area P3, the distance between the second plasma generation unit 81b and the turntable 2 is set at the second distance smaller than the above-mentioned first distance (see S130). Due to the second distance relatively smaller than the first distance, in the third process area P3, an amount of the ions reaching the wafers W is more than that in the second process area P2. Here, it should be noted that an amount of radicals in the third process area P3 is also more than that in the second process area P2. Accordingly, in the third process area P3, the first process gas on the wafers W is nitride by plasma having relatively high ion energy and high-dense radicals, and the deposited nitride film is more efficiently modified than that in the second process area P2.

The second distance is not limited as long as the second distance is shorter than the first distance, but is preferred to be set in a range from 20 to 60 mm in terms of more efficiently modifying the nitride film.

The wafers W treated by the second plasma pass the separation area D by the rotation of the turntable 2 (S140). The separation area D is an area to separate the first process area P1 from the third process area P3 so that the unnecessary nitriding gas and the modifying gas do not intrude into the first process area P1.

In the embodiments, by keeping the turntable 2 rotating, the adsorption of the first process gas on the wafers W, the nitriding process of the first process gas adsorbing on the wafers W, and the plasma modification of the reaction product are performed in this order many times. In other words, the film deposition process by the ALD method and the modification process of the deposited film are performed many times by rotating the turntable 2.

Here, in the substrate processing apparatus of the embodiments, the separation areas D are arranged between the process areas P1 and P2 on both sides in the circumferential direction of the turntable 2. Because of this, in the separation areas D, each of the process gas and the plasma processing gases flows toward each of the exhaust openings 61 and 62 while being prevented from mixing with each other.

Next, a description is given below of an example of preferred implementing conditions when performing the method, for example, the film deposition of the nitride film on the wafers W and the modification treatment of the deposited nitride film.

A flow rate of the first process gas in the film deposition process is not limited, but can be set at, for example, a range of about 900 to 1500 sccm.

A flow rate of an ammonia-containing gas contained in the plasma processing gases is not limited, but can be set at, for example, a range of about 4000 to 5000 sccm.

The pressure inside the vacuum chamber 1 is not limited, but can be set at, for example, a range of about 0.75 to 0.9 Torr.

The temperature of the wafers W is not limited, but can be set at, for example, a range of about 350 to 450 degrees C.

The rotational speed of the turntable 2 is not limited, but can be set at, for example, a range of 60 to 300 rpm.

Next, a more detailed description is given below of the embodiments of the present invention by citing specific working examples.

Working Example 1

In the plasma treatment of the method for processing the substrate of the embodiments, a description is given below of a working example of having acknowledged that the generation of the loading effect can be prevented and a thin film having a desired film quality can be deposited by passing a wafer through an area having low ion energy and a low radical concentration (the second process area P2) and then passing the wafer through an area having high ion energy and a high radical concentration (the third process area P3).

Figure 9:
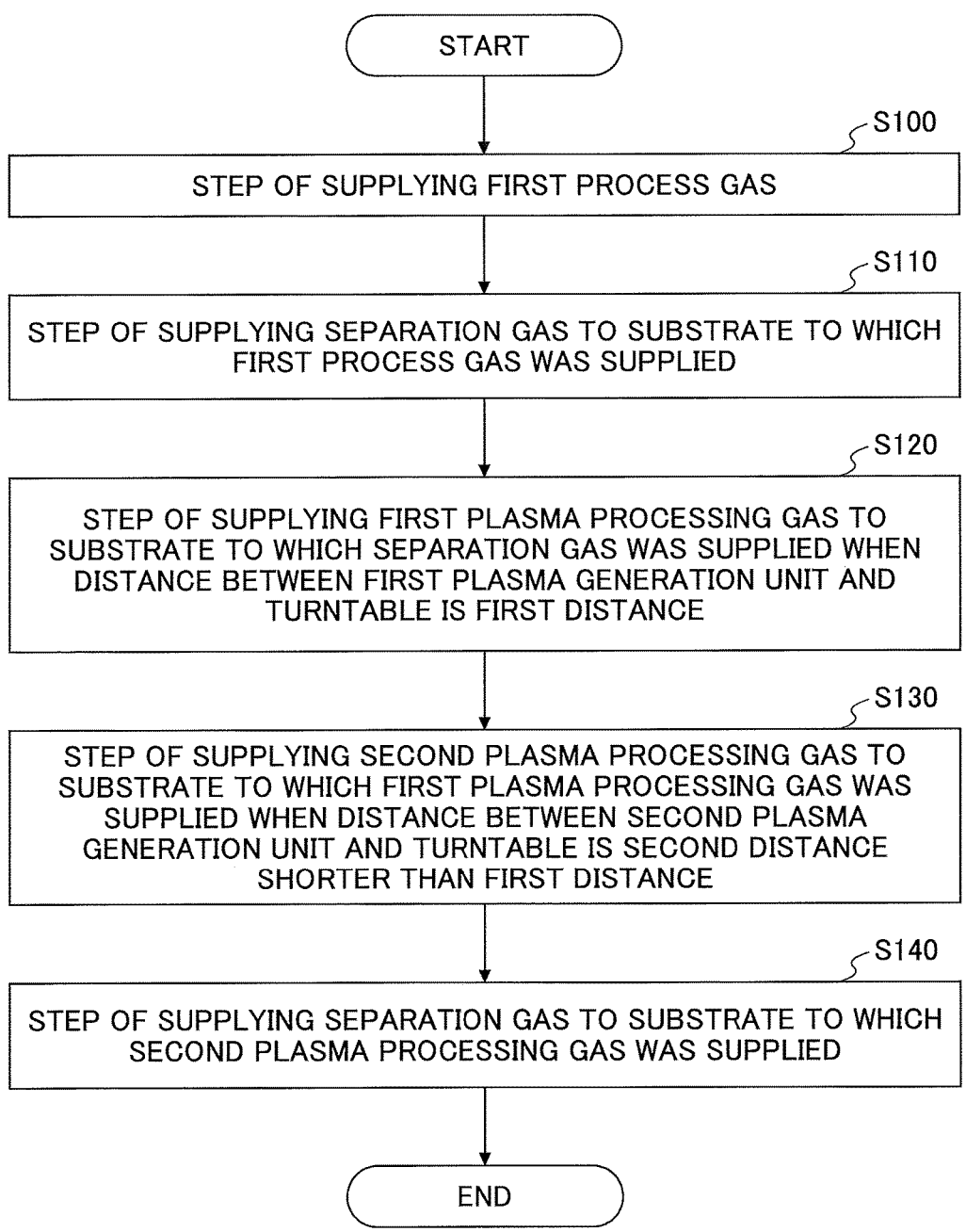
FIG. 9 is a flowchart illustrating an example of a method for processing a substrate according to the embodiment of the present invention.

A film deposition process was performed on a wafer W under the following conditions by the method for processing the substrate as described with reference to FIG. 9 by using the substrate processing apparatus of the embodiments as described with reference to FIGS. 1 through 8.

The film deposition process of the working example 1 was as follows:
First process gas: DCS (dichlorosilane)
Processing gas in step S120: $NH_3$=4000 sccm
First distance in step S120: 90 mm
Processing gas in step S130: $NH_3/Ar/H_2$=300/1900/600 sccm
Second distance in step S130: 37.5 mm.

Moreover, as a comparative example 1, the film deposition process of the comparative example 1 was performed as well as the method of the working example 1 except that the second distance in step S130 was set at 90 mm.

Furthermore, as a comparative example 2, the film deposition process of the comparative example 1 was performed as well as the method of the working example 1 except that the first distance in step S120 was set at 37.5 mm and that the second distance in step S130 was set at 90 mm.

By measuring each film thickness of reaction products (nitride films) on the wafers W obtained after performing the working example 1 and the comparative examples 1 and 2, a film deposition rate per one cycle from steps S100 to S140 and uniformity within a surface of the wafer W of the deposited film were obtained.

Figure 10:
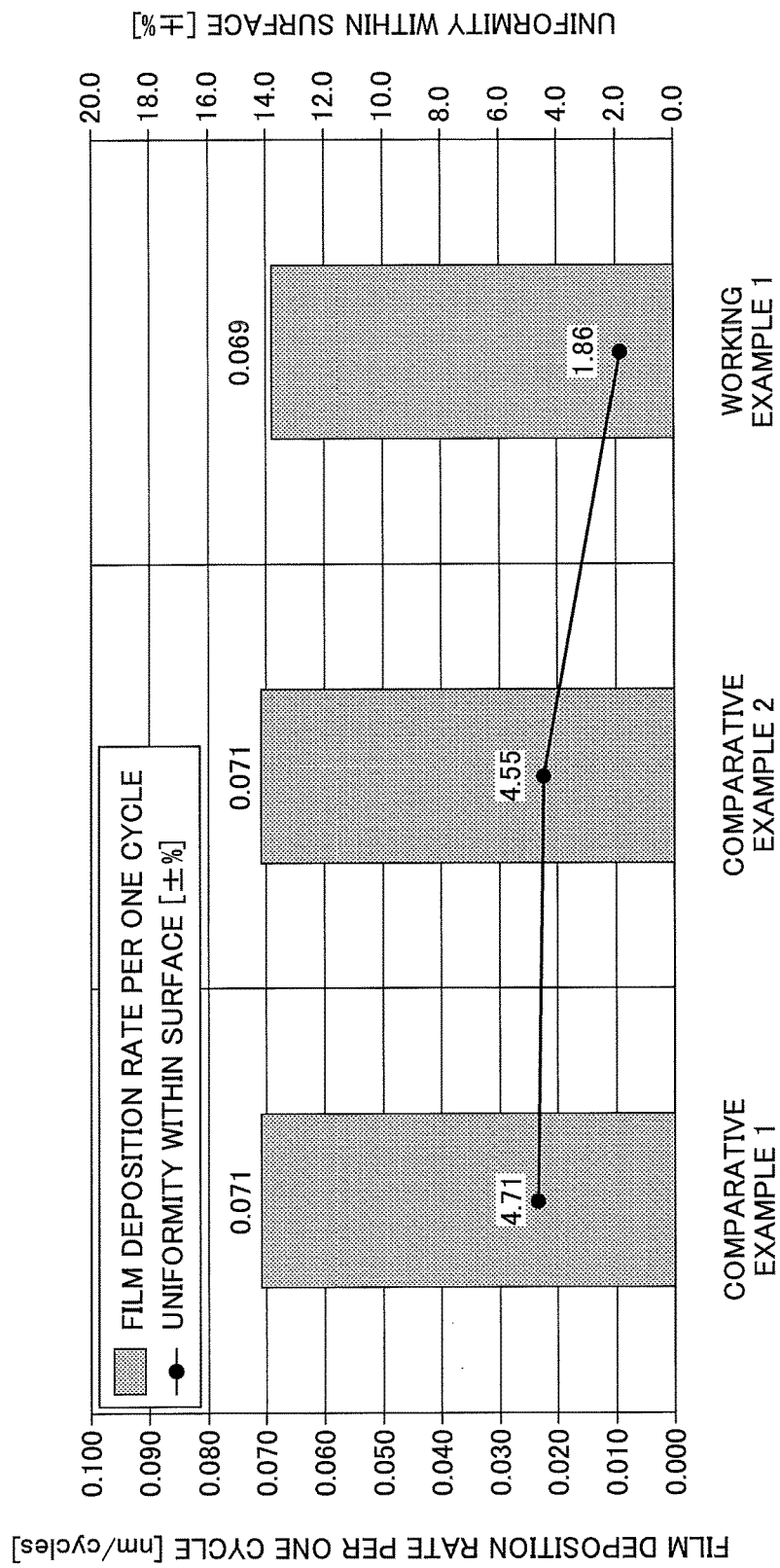
FIG. 10 is a schematic diagram for explaining an example of an effect of the method for processing the substrate according to an embodiment of the present invention.

FIG. 10 shows a schematic chart for explaining an example of an effect of the method for processing the substrate of the working example 1. More specifically, bar graphs in FIG. 10 show results regarding a film deposition rate, and a line graph shows results of the uniformity within the surface of the wafer W. Here, data of the uniformity within the surface of the wafer W are values obtained by dividing a remainder of subtracting a minimum film thickness from a maximum film thickness within the wafer surface by the maximum film thickness, and indicate a superior uniformity within the surface of the wafer W as the values decrease.

As clearly noted from the film deposition rates shown in FIG. 10, there is not much difference in film deposition rate per one cycle among the working example 1 and the comparative examples 1 and 2. Because the film deposition rate was almost the same as the other examples even in the comparative example 1 in which the first and second distances are both 90 mm, the adsorbed first process gas was considered to be preferably nitrided in all of the examples.

On the other hand, from the results of the uniformity within the surface of the wafer W shown in FIG. 10, it is noted that the method for processing the substrate of the working example 1 can deposit a film having the uniformity more excellent than those of the method for processing the substrate of the comparative examples 1 and 2.

From the results discussed above, it is noted that the method for processing the substrate according to the working example 1 can deposit a film having very excellent uniformity within a surface of a wafer W while maintaining a certain film deposition rate by passing the substrates through an area having small ion energy and a low radical concentration (second process area P2) and then passing the substrates through an area having great ion energy and a high radical concentration (third process area P3) in a plasma treatment.

In addition, a wet etching was performed in the obtained film by using dilute hydrofluoric acid of 0.5%.

Figure 11:
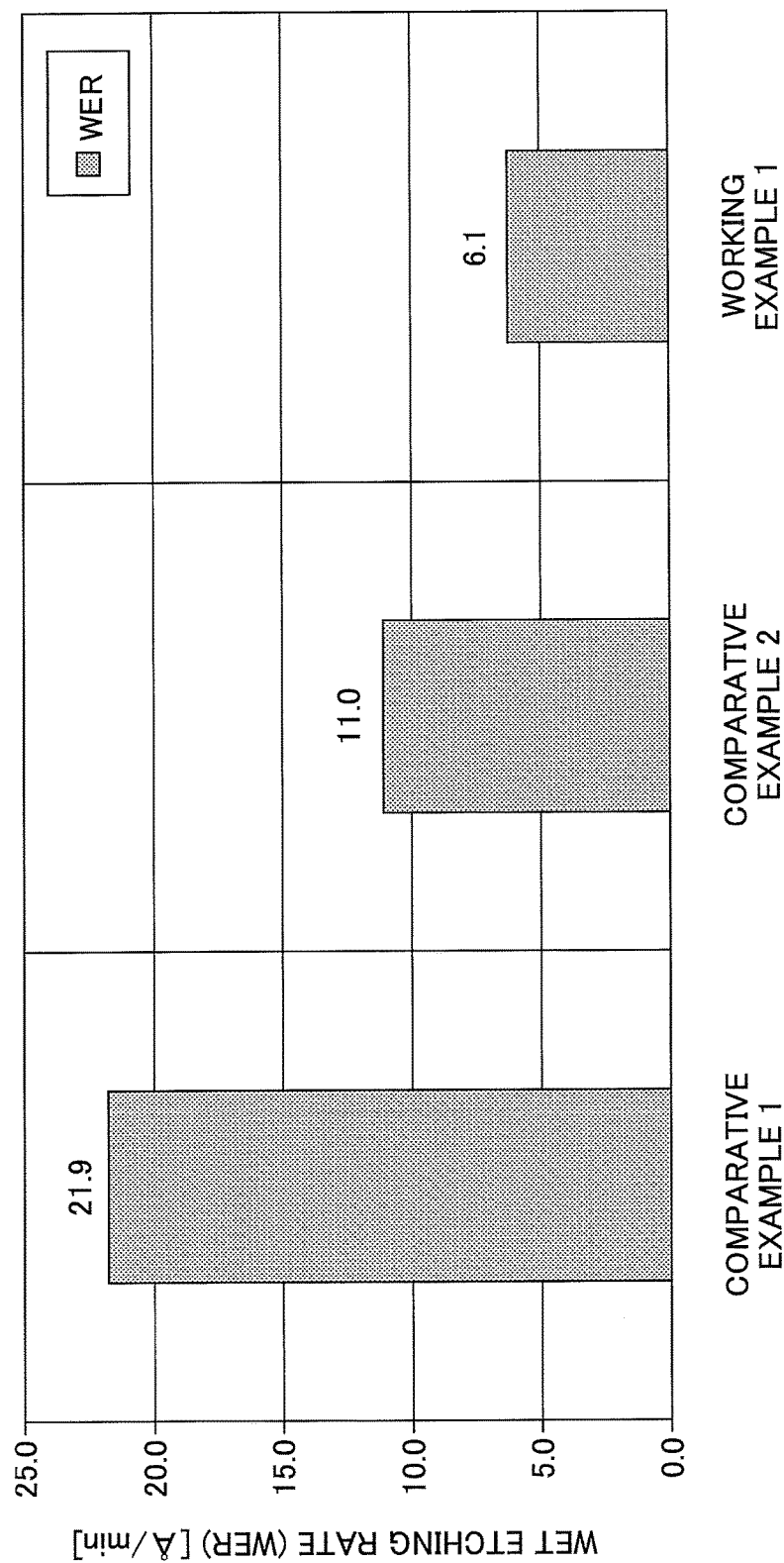
FIG. 11 is a schematic diagram for explaining another example of the effect of the method for processing the substrate according to an embodiment of the present invention.

FIG. 11 shows a schematic chart for explaining another example of an effect of the method for processing the substrate of the embodiments. More specifically, FIG. 11 is a chart showing a wet etching rate of the obtained films.

As shown in FIG. 11, the silicon nitride film obtained by the working example 1 had an etching rate lower than the silicon nitride film obtained by the comparative examples 1 and 2. That is to say, it is noted that the silicon nitride film obtained by the method for processing the substrate of the working example 1 is preferably available for intended purpose of a mask and the like in an etching process. This is because the method for processing the substrate of the working example 1 could modify the nitride film more efficiently by passing the substrate through the area having the small ion energy and the low radical concentration (second process area P2) and then passing the substrate through the area having the great ion energy and the high radical concentration (third process area P3) in the plasma treatment.

An evaluation was performed to determine whether the loading effect can be prevented by the method for processing the substrate of the working example 1.

Figure 12A:
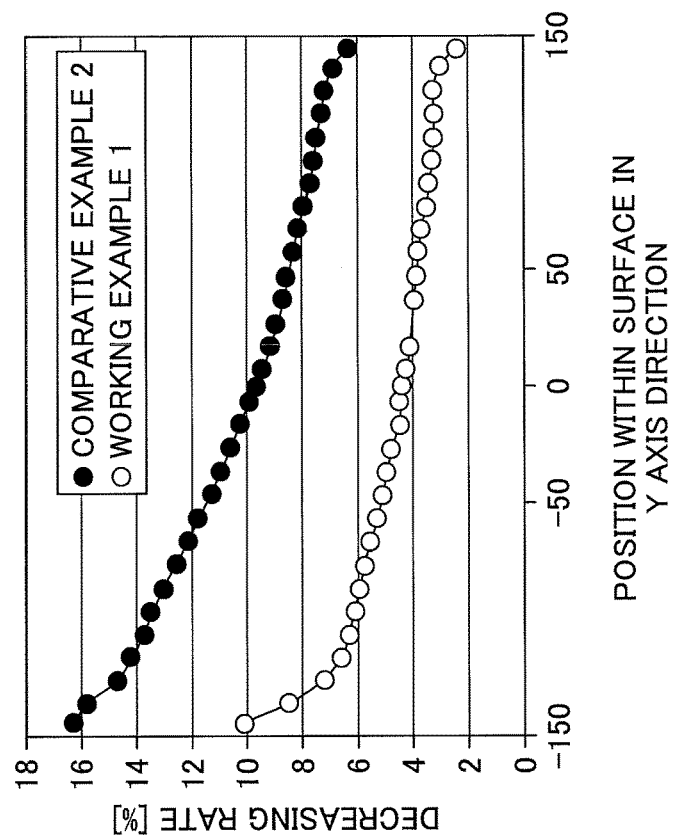
FIGS. 12A and 12B are schematic diagrams for explaining another example of the effect of the method for processing the substrate according to an embodiment of the present invention.
Figure 12B:
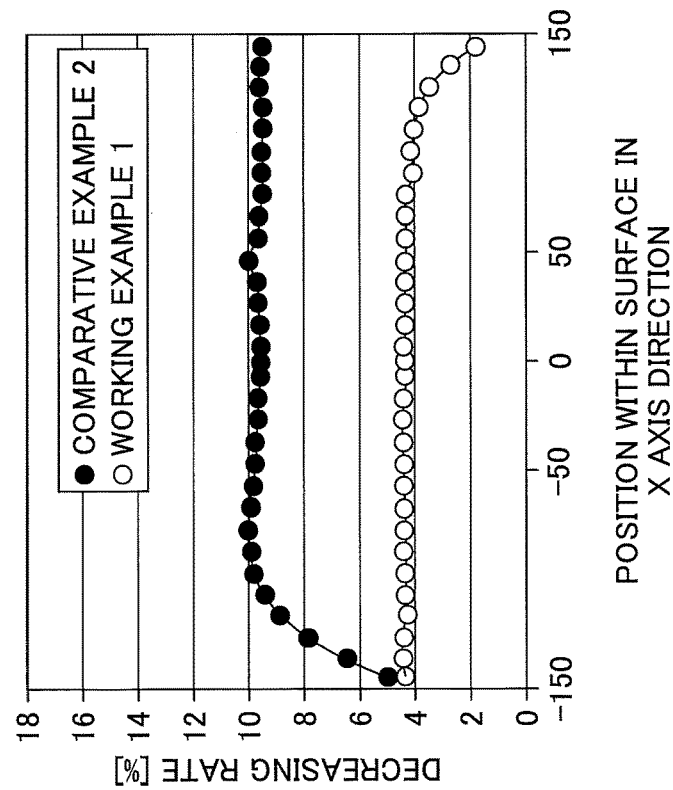

FIGS. 12A and 12B show schematic charts for explaining another example of an effect of the method for processing the substrate of the working example 1. More specifically, FIGS. 12A and 12B are charts plotting a decreasing rate of a film thickness from a target film thickness in an X axis direction (FIG. 12A) and in a Y axis direction (FIG. 12B), respectively. In the working example 1, the Y axis direction is a direction linearly connecting the center of the wafer W to the rotational center of the turntable 2 (this direction is made positive), and the center of the Y axis coincides with the center of the wafer W. Moreover, the X axis direction is an axial direction perpendicular to the Y axis direction and passing a principal surface of the wafer W. The center of the X axis coincides with the center of the wafer W, and a positive direction of the X axis is a direction heading for the downstream from the upstream in the rotational direction of the turntable 2.

As shown in FIGS. 12A and 12B, the decreasing rates of the working example 1 are smaller than those of the comparative example 2 in both of the X axis direction and the Y axis direction. In other words, it was noted that the method for processing the substrate of the working example 1 can prevent the generation of the loading effect.

Working Example 2

A description is given below of a working example in which a relationship between a distance from the plasma generation unit to the wafer W and an amount of nitriding the wafer W in itself.

A film deposition process was performed on a wafer W under the following conditions by the method for processing the substrate as described with reference to FIG. 9 by using the substrate processing apparatus of the embodiments as described with reference to FIGS. 1 through 8.

As the film deposition conditions, the first distance in step S120 and the second distance in step S130 are set at the same value. More specifically, the values are set at 30 mm, 37.5 mm, 60 mm and 90 mm, and the amount of nitriding the wafer W after the film deposition process was measured at each of the setting distances.

FIG. 13 is a schematic chart for explaining another example of an effect of the method for processing the substrate of the working example 2.

As shown in FIG. 13, an amount of nitriding the wafer W increases with the decreasing distance between the plasma generation unit and the wafer W. This means that the ion energy of plasma and the density of radicals increase with the decreasing distance between the plasma generation unit and the wafer W. In particular, because the precursor has a great influence on the wafer W and the wafer W is likely to be nitrided in itself in the initial stage of the film deposition process, passing the wafer W through the area having the great ion energy and the high radical concentration (the third process area P3) after passing the wafer W through the area having the small ion energy and the low radical concentration (the second process area P2) is preferable like the method for processing the substrate of the working example 2.

As discussed above, it was noted that the generation of the loading effect can be prevented and a thin film having a desired film quality can be deposited by passing a substrate through an area having a small ion energy and a low radical concentration (second process area P2) and then by passing the substrate through an area having a great ion energy and a high radical concentration (third process area P3) from the working examples 1 and 2.

Working Example 3

In a method for processing a substrate of a working example 3, a comparative experiment of an amount of film deposition, a film quality and the like was performed between the case of rotating the turntable 2 in a clockwise fashion illustrated by the arrow of FIG. 2 and the case of rotating the turntable 2 in a counterclockwise fashion opposite to the arrow of FIG. 2 by using the substrate processing apparatus described with reference to FIGS. 1 through 8.

Figure 14:
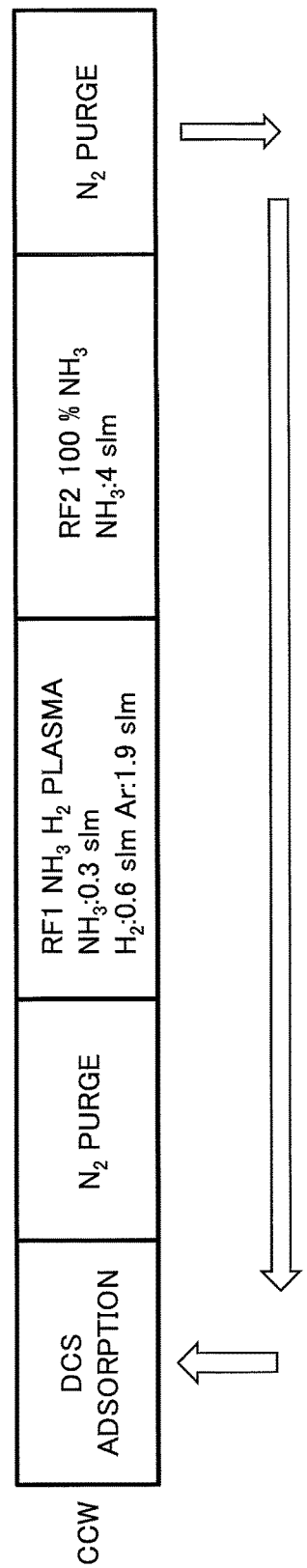
FIG. 14 is a diagram illustrating an example of a process flow of the method for processing the substrate according to an embodiment of the present invention.

FIG. 14 is a diagram illustrating a process flow of an example of the method for processing the substrate of the working example 3, and the process flow is performed when the turntable 2 is rotated in the clockwise fashion the same as the arrow of FIG. 2. Here, in the working example 3, a description is given below by citing an example of using DCS that is a silicon-containing gas as the first process gas, a mixed gas composed of ammonia gas, hydrogen gas and argon gas as the first plasma processing gas, and ammonia gas as the second plasma processing gas. Here, a flow rate of each gas contained in the first plasma processing gas was as follows: ammonia gas is 0.3 slm; hydrogen gas is 0.6 slm; and argon gas is 1.9 slm. The first plasma processing gas was a hydrogen-rich gas. Also, the second plasma processing gas was composed of hundred-percent ammonia, and the flow rate thereof was 4 slm. By rotating the turntable 2 in a counterclockwise fashion, the wafer W sequentially passed the first process area P1, the separation area D, the first plasma generation unit 81a (which may be hereinafter called a "first plasma treatment area" or "first plasma process area"), the second plasma generation unit 81b (which may be hereinafter called "second plasma treatment area" or "second plasma process area"), and the separation area D, and a process flow illustrated in FIG. 14 was repeated.

Figure 15A:
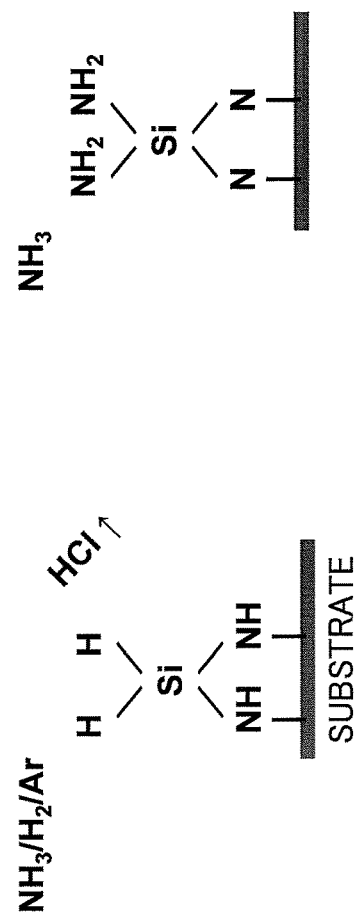
FIGS. 15A through 15C are diagrams illustrating a chemical reaction model occurring on a surface of a wafer when performing the process flow illustrated in FIG. 14.
Figure 15B:
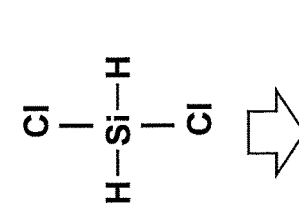
Figure 15C:
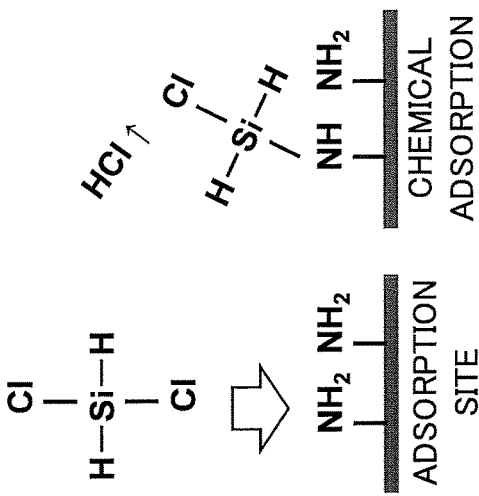

FIGS. 15A through 15C are diagrams illustrating a chemical reaction model that occurred on a surface of a wafer W when performing the process flow in FIG. 14. FIG. 15A is a diagram illustrating a state in which the first plasma treatment is performed on the wafer W by the first plasma generation unit 81a. In the first plasma treatment, by performing the plasma treatment on the surface of the wafer W on which DCS had adsorbed by the first plasma composed of ($NH_3+H_2+Ar$), NH adsorbed on the surface of the wafer W, and then Si adsorbed on NH, thereby having terminated with hydrogen. Here, Cl and H of DCS reacted with each other and was released as HCl.

FIG. 15B is a diagram illustrating a state in which the second plasma treatment was performed on the wafer W by the second plasma generation unit 81b. When DOS was supplied, as illustrated in FIG. 15B, because the adsorption site terminated with $NH_2$, Si could readily adsorb to NH by causing the terminated H and Cl of DCS to react with each other so as to escape as HCl.

In this manner, by nitriding and modifying a Si-containing film with first plasma containing hydrogen gas and then by nitriding so as to form an adsorption site with second plasma containing ammonia gas and no hydrogen gas, DCS could readily adsorb to the adsorption site when DCS was supplied. This causes the loading effect to be preferable, thereby efficiently depositing a Si-containing film.

Figure 16:
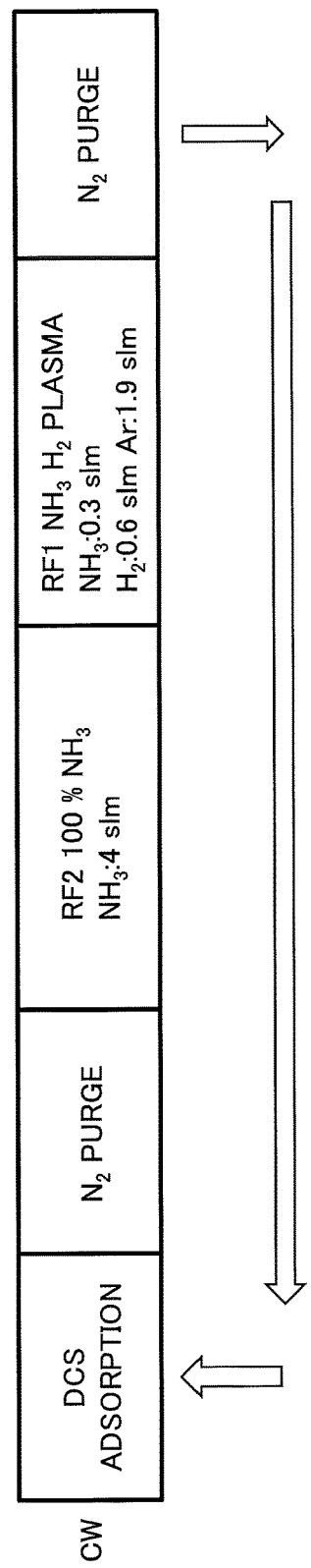
FIG. 16 is a diagram illustrating an example of a process flow of a method for processing a substrate according to a comparative example.

FIG. 16 is a diagram illustrating an example of a process flow of a method for processing a substrate according to a comparative example. The process flow in FIG. 16 is performed when rotating the turntable 2 in a counterclockwise fashion opposite to the arrow in FIG. 2. Comparing FIG. 16 with FIG. 14, a processing order of the first plasma treatment and the second plasma treatment is made opposite, and the first plasma treatment by the mixed gas of hydrogen gas, ammonia gas and argon gas was performed after performing the second plasma treatment by only ammonia gas.

Figure 17C:
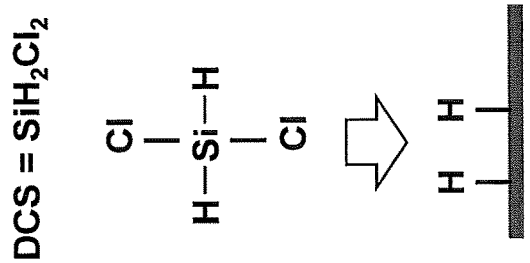
FIGS. 17A through 17C are diagrams illustrating a chemical reaction model occurring on a surface of a wafer when performing the process flow illustrated in FIG. 16.
Figure 17B:
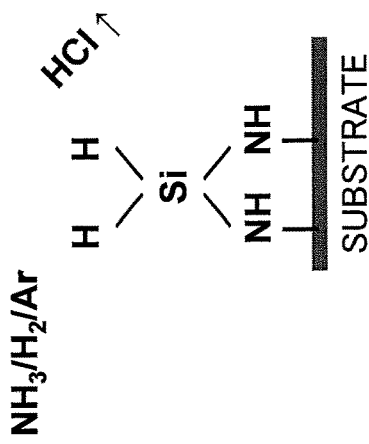
Figure 17A:
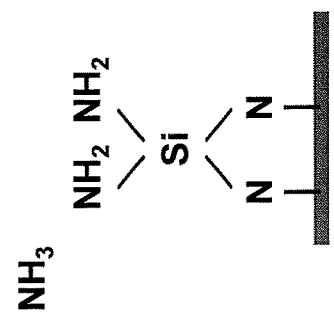

FIGS. 17A through 17C are diagrams illustrating a chemical reaction model that occurred on a surface of a wafer W when performing the process flow of the method for processing the substrate illustrated in FIG. 16. FIG. 17A is a diagram illustrating a state in which the first plasma treatment (first time) was performed on the wafer W by the second plasma generation unit 81b. In the first plasma treatment, by performing a plasma treatment with the first plasma composed of $NH_3$ on a state in which DCS had adsorbed on a surface of the wafer W, the terminated H and NH of the plasma react with each other, thereby terminating with $NH_2$.

FIG. 17B is a diagram illustrating a state in which the second (second time) plasma treatment was performed on the wafer W by the first plasma generation unit 81a. By performing a plasma treatment on the wafer W on which DCS had adsorbed with the second plasma composed of ($NH_3+H_2+Ar$), the terminated $NH_2$ and Cl reacted with each other and got away as HCl, thereby having terminated H.

FIG. 17C is a diagram illustrating a state in which DCS of the first process gas was supplied to the wafer W in the first process area P1. When DCS was supplied, as illustrated in FIG. 17B, because the adsorption site terminated with H, DCS was difficult to adsorb thereto.

Thus, even though the Si containing film was nitrided by the first plasma containing ammonia gas and no hydrogen gas and then the Si-containing film was nitrided and modified by the second plasma containing hydrogen gas, the Si-containing film terminated with H without forming an adsorption site and became difficult for DCS to adsorb thereto when DCS was supplied. This does not make the loading effect preferable, and does not cause the Si-containing film to be deposited efficiently.

TABLE 1 shows results of films deposited all over a whole flat surface of a wafer W by the method for processing the substrate of the working example 3 of the present invention and by the method for processing the substrate of the comparative example. With respect to the process conditions, a substrate temperature was 400 degrees C., and a pressure inside the vacuum chamber 1 was 0.75 Torr. A flow rate of DCS was 1000 sccm (further 500 sccm of $N_2$ was supplied), and a flow rate of ammonia gas in the first plasma treatment area 81a was 300 slm. A flow rate of hydrogen gas was 600 sccm, and a flow rate of argon gas was 1900 sccm. A flow rate of ammonia gas in the second plasma treatment area 81b was 4000 slm, and a flow rate of $N_2$ gas in the separation areas D was 3000 sccm.

TABLE 1

| ITEM | CCW | CW |
| --- | --- | --- |
| Win AVG (nm) | 24.2599 | 22.4666 |
| Max (nm) | 24.6184 | 22.9386 |
| Min (nm) | 23.7627 | 21.6213 |
| Range (nm) | 0.856 | 1.317 |
| DEPO rate (nm/min) | 0.651 | 0.601 |
| CYC rate (nm/cycle) | 0.065 | 0.060 |
| Win Unif (± %) | 1.76 | 2.93 |
| Thickness | 24.26 | 22.47 |

As shown in TABLE 1, a deposition rate per one cycle in the method for processing the substrate of the working example 3 was 0.065 nm/cycle, and a deposition rate per one cycle in the method for processing the substrate in the method for processing the substrate of the comparative example was 0.060 nm/cycle. The deposition rate per one cycle of the method for processing the substrate of the working example 3 was about 8% higher than that of the comparative example. Moreover, the uniformity within a surface of the method for processing the substrate of the working example 3 was 1.76%, and the uniformity within a surface of the method for processing the substrate of the comparative example 3 was 2.93%. The uniformity within a surface of the method for processing the substrate of the working example 3 was preferable to that of the comparative example.

Figure 18:
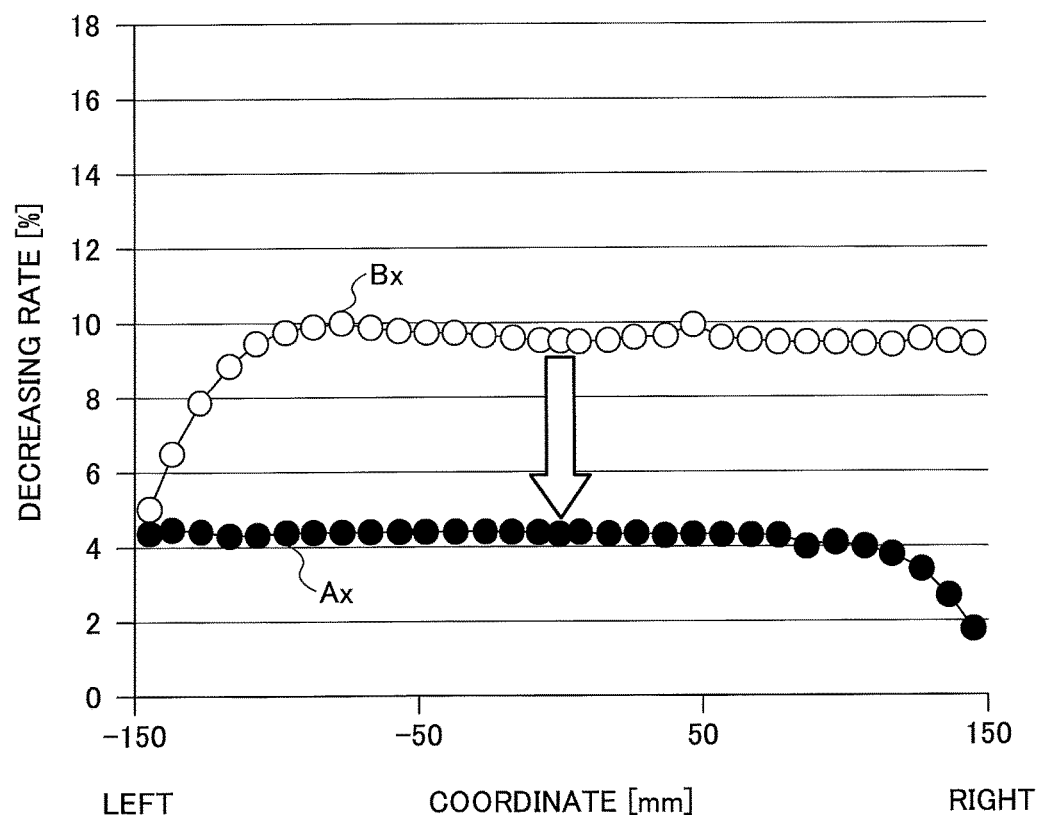
FIG. 18 is a chart showing a comparison result in an X line of a method for processing a substrate of a third working example and a method for processing a substrate of a comparative example when a wafer having a pattern formed therein has a surface area as ten times as large a wafer having a flat surface.

FIG. 18 is a chart showing a comparative result of the uniformity within the surface in an X line between the method for processing the substrate of the working example 3 and the method for processing the substrate of the comparative example when a pattern was formed in a wafer W and the wafer W had a surface area ten times as large as that of a wafer W having a flat surface. As shown in FIG. 18, a curve Ax showing the uniformity within the surface in the method for processing the substrate of the working example 3 is widely lower than a curve Bx showing the uniformity within the surface in the method for processing the substrate of the comparative example, and indicates a preferable uniformity within the surface.

Figure 19:
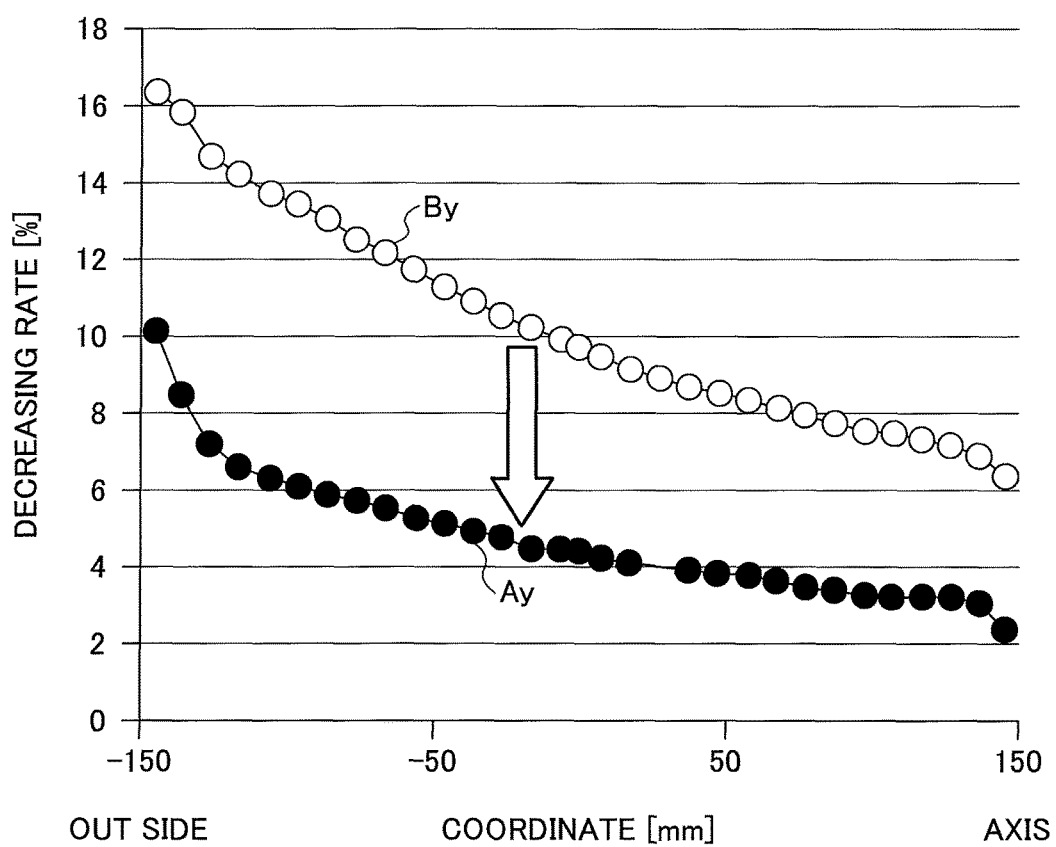
FIG. 19 is a chart showing a comparison result in a Y line of a method for processing a substrate of a third working example and a method for processing a substrate of a comparative example when a wafer having a pattern formed therein has a surface area as ten times as large a wafer having a flat surface.

FIG. 19 is a chart showing a comparative result of the uniformity within the surface in a Y line between the method for processing the substrate of the working example 3 and the method for processing the substrate of the comparative example when a pattern was formed in a wafer W and the wafer W had a surface area ten times as large as that of a wafer W having a flat surface. As shown in FIG. 19, a curve Ay showing the uniformity within the surface in the method for processing the substrate of the working example 3 is widely lower than a curve By showing the uniformity within the surface in the method for processing the substrate of the comparative example, and indicates a preferable uniformity within the surface.

In this manner, the method for processing the substrate of the working example 3 could obtain better results in both of the film deposition rate and the uniformity within the surface than that of the method for processing the substrate of the comparative example.

Here, the method for processing the substrate of the working example 3 can be implemented not only by the substrate processing apparatus illustrated in FIGS. 1 through 8, but also by a substrate processing apparatus whose first and second plasma generation units 81a and 81b have the same height as each other. Because the method for processing the substrate of the working example 3 focuses on the supply order of the plasma processing gases, the method for processing the substrate of the working example 3 can be applied to the substrate processing apparatus without respect to the height of the plasma generation units 81a and 81b.

According to the embodiments of the present invention, there is provided a method for processing a substrate and a substrate processing apparatus that can prevent the generation of the loading effect and deposit a thin film having a desired film quality.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A method for processing a substrate, comprising steps of:

supplying a silicon-containing gas to a surface of a substrate provided in a chamber so as to cause the silicon-containing gas to adsorb on the surface of the substrate;

converting the silicon-containing gas adsorbed on the surface of the substrate to an H terminated silicon by performing a first plasma treatment on the surface of the substrate having the silicon-containing gas adsorbing on the surface of the substrate using a first plasma generated from a first plasma processing gas containing hydrogen gas and ammonia gas; and depositing a silicon nitride film and modifying the silicon nitride film while converting the H terminated silicon to an $NH_2$ terminated silicon by performing a second plasma treatment on the surface of the substrate subject to the first plasma treatment using a second plasma generated from a second plasma processing gas containing ammonia gas and no hydrogen gas.

2. The method as claimed in claim 1, wherein the step of supplying the silicon-containing gas to the surface of the substrate, the step of performing the first plasma treatment on the surface of the substrate and the step of performing the second plasma treatment on the surface of the substrate are repeated in a cycle.

3. The method as claimed in claim 2, further comprising a step of:

supplying a purge gas to the surface of the substrate immediately before and after the step of supplying the silicon-containing gas to the surface of the substrate.

4. The method as claimed in claim 2, wherein the chamber includes therein a turntable capable of receiving the substrate thereon, and a first process area capable of supplying the process gas to the surface of the substrate, a first plasma treatment area capable of performing the first plasma treatment on the surface of the substrate and a second plasma treatment area capable of performing the second plasma treatment on the surface of the substrate that are arranged along a rotational direction of the turntable, and wherein the step of supplying the silicon-containing gas to the surface of the substrate, the step of performing the first plasma treatment on the surface of the substrate and the step of performing the second plasma treatment on the surface of the substrate are repeated in a cycle by passing the substrate through the first process area, the first plasma treatment area and the second plasma treatment area in this order by rotating the turntable.

5. The method as claimed in claim 4, wherein purge gas supply areas for supplying a purge gas to the surface of the substrate are provided on both sides of the first process area, and further comprising a step of:

supplying the purge gas to the surface of the substrate before and after the step of supplying the silicon-containing gas to the surface of the substrate.

6. The method as claimed in claim 1, wherein the first plasma processing gas is a mixed gas containing hydrogen gas, ammonia gas and argon gas.

7. The method as claimed in claim 1, wherein the second plasma processing gas consists of ammonia gas.

8. The method as claimed in claim 1, wherein the process gas contains at least one of diisopropylamino-silane, tris(dimethylamino)silane, bis(tertiary-butyl-amino)silane, dichlorosilane, hexachlorodisilane, titanium tetrachloride, titanium methylpentanedionato bis(tetramethylheptanedionato), trimethylaluminium, tetrakis(ethylmethylamino)zirconium, tetrakis (ethylmethylamino)hafnium, and strontium bis(tetramethylheptanedionato).

* * * * *